United States Patent
Shenoy et al.

(10) Patent No.: US 8,742,570 B2
(45) Date of Patent: Jun. 3, 2014

(54) BACKPLATE INTERCONNECT WITH INTEGRATED PASSIVES

(75) Inventors: Ravindra V. Shenoy, Dublin, CA (US); Marc Maurice Mignard, San Jose, CA (US); Manish Kothari, Cupertino, CA (US); Clarence Chui, San Jose, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 327 days.

(21) Appl. No.: 13/229,561

(22) Filed: Sep. 9, 2011

(65) Prior Publication Data

US 2013/0063415 A1 Mar. 14, 2013

(51) Int. Cl.
*H01L 23/34* (2006.01)

(52) U.S. Cl.
USPC ............... 257/724; 257/E27.009; 257/414; 257/680; 438/107

(58) Field of Classification Search
CPC ............ H01L 27/4643; H01L 27/4683; H01L 27/4627; H01L 23/48
USPC ............... 257/E27.009, E27.114, 414, 419, 257/431–434, 676, 679, 680, 688, 724; 438/107, 109, 110; 361/809, 784; 445/24, 25; 345/418
See application file for complete search history.

(56) References Cited

U.S. PATENT DOCUMENTS

| | | | |
|---|---|---|---|
| 5,570,274 A * | 10/1996 | Saito et al. ..................... | 361/784 |
| 6,040,937 A | 3/2000 | Miles | |
| 6,297,551 B1 * | 10/2001 | Dudderar et al. .............. | 257/723 |
| 6,477,286 B1 * | 11/2002 | Ouchi .............................. | 385/14 |
| 6,507,110 B1 * | 1/2003 | Chen et al. ...................... | 257/728 |
| 6,674,159 B1 | 1/2004 | Peterson et al. | |
| 6,674,562 B1 | 1/2004 | Miles et al. | |
| 6,686,653 B2 * | 2/2004 | Jerominek et al. ............. | 257/680 |
| 6,809,412 B1 * | 10/2004 | Tourino et al. ................. | 257/678 |
| 7,042,623 B1 * | 5/2006 | Huibers et al. ................ | 359/291 |
| 7,123,216 B1 | 10/2006 | Miles | |
| 7,184,202 B2 | 2/2007 | Miles et al. | |
| 7,307,773 B2 * | 12/2007 | Chen et al. ..................... | 359/290 |
| 7,327,510 B2 | 2/2008 | Cummings et al. | |
| 7,327,554 B2 * | 2/2008 | Otsuka et al. .............. | 361/306.3 |

(Continued)

FOREIGN PATENT DOCUMENTS

DE 102007048604 A1 4/2009
WO WO-2011037534 A1 3/2011

OTHER PUBLICATIONS

Chui et al. "The iMod™ Display: Considerations and Challenges in Fabricating MOEMS on Large Area Glass Substrates." Proc. Of SPIE, Vo. 6466, 646609, 1-8. (2007).

(Continued)

*Primary Examiner* — Chris Chu
(74) *Attorney, Agent, or Firm* — Knobbe, Martens, Olson & Bear LLP

(57) ABSTRACT

This disclosure provides systems, methods and apparatus for manufacturing display devices having electronic components mounted within a display device package. In one aspect, the electronic component connects to the exterior of the display device through pads that run below a seal that holds a substrate and a backplate of the display device together. In another aspect the electronic components also connect to an electromechanical device within the display device, as well as connecting to pads that are external to the display device.

37 Claims, 12 Drawing Sheets

(56) References Cited

U.S. PATENT DOCUMENTS

| | | | |
|---|---|---|---|
| 7,613,010 B2 * | 11/2009 | Ono et al. | 361/784 |
| 7,675,665 B2 | 3/2010 | Hagood et al. | |
| 7,826,127 B2 | 11/2010 | Khonsari et al. | |
| 2002/0055283 A1 * | 5/2002 | Yoon et al. | 439/66 |
| 2002/0056560 A1 | 5/2002 | Liu | |
| 2005/0170614 A1 * | 8/2005 | Patel et al. | 438/460 |
| 2006/0067642 A1 | 3/2006 | Tyger | |

OTHER PUBLICATIONS

International Search Report and Written Opinion—PCT/US2012/053661—ISA/EPO—Jul. 9, 2013.
Partial International Search Report—PCT/US2012/053661—ISA/EPO—Apr. 12, 2013.

* cited by examiner

BACKPLATE INTERCONNECT WITH INTEGRATED PASSIVES

TECHNICAL FIELD

This disclosure relates to packaging for electromechanical systems. More particularly, it relates to systems and methods for manufacturing dual substrate packaging devices.

DESCRIPTION OF THE RELATED TECHNOLOGY

Electromechanical systems (EMS) include devices having electrical and mechanical elements, actuators, transducers, sensors, optical components (such as mirrors) and electronics. Electromechanical systems can be manufactured at a variety of scales including, but not limited to, microscales and nanoscales. For example, microelectromechanical systems (MEMS) devices can include structures having sizes ranging from about a micron to hundreds of microns or more. Nanoelectromechanical systems (NEMS) devices can include structures having sizes smaller than a micron including, for example, sizes smaller than several hundred nanometers. Electromechanical elements may be created using deposition, etching, lithography and/or other micromachining processes that etch away parts of substrates and/or deposited material layers, or that add layers to form electrical and electromechanical devices.

One type of EMS device is an interferometric modulator (IMOD). As used herein, the term interferometric modulator, or interferometric light modulator, refers to a device that selectively absorbs and/or reflects light using the principles of optical interference. In some implementations, an interferometric modulator may include a pair of conductive plates, one or both of which may be transparent and/or reflective, wholly or in part, and capable of relative motion upon application of an appropriate electrical signal. In an implementation, one plate may include a stationary layer deposited on a substrate and the other plate may include a reflective membrane separated from the stationary layer by an air gap. The position of one plate in relation to another can change the optical interference of light incident on the interferometric modulator. Interferometric modulator devices have a wide range of applications, and are anticipated to be used in improving existing products and creating new products, especially those with display capabilities.

SUMMARY

The systems, methods and devices of the disclosure each have several innovative aspects, no single one of which is solely responsible for the desirable attributes disclosed herein.

One innovative aspect of the subject matter described in this disclosure can be implemented in an electronic device that includes a backplate having a recess and at least one electronic component mounted in the recess and in electrical communication with one or more upper electrical traces extending from the electronic component to one or more conductive pads on the backplate. The electronic device also includes a substrate having one or more electromechanical devices and a seal configured to circumscribe the one or more electromechanical devices. The seal is further configured to adhere the backplate and the substrate to each other and to provide for a sealed area. In this aspect the electronic device also includes one or more connection pads inside the sealed area and one or more pads outside the sealed area, where at least one of the one or more connection pads inside the sealed area has an electrical connection with the one or more conductive pads on the backplate and the one or more pads outside the sealed area.

In one aspect of the electronic device, the electrical connection between the one or more pads outside the sealed area and the one or more connection pads passes underneath the seal. In another aspect the electrical connection between the one or more pads outside the sealed area and the one or more connection pads is integrated into the substrate. In another aspect, the electronic device further includes a second electronic component mounted in the recess and electrically coupled to the at least one electronic component. In another aspect, the backplate is glass. In another aspect, the seal includes a metal to metal seal or an epoxy seal. In another aspect, the substrate has one or more second connection pads providing an electrical connection from the at least one electronic component to the electromechanical device. In another aspect, the electromechanical device is an interferometric modulator device. In another aspect, one or more pads outside the seal area may include at least one or more flex pads.

In yet another aspect, the electronic device further includes a processor that is configured to communicate with a display and process image data. In another aspect, the at least one electronic component is configured to send at least one signal to the display. In an aspect, the electronic device includes a controller configured to send at least a portion of the image data to the at least one electronic component. In an aspect, the electronic device includes an image source module configured to send the image data to the processor that includes at least one of a receiver, transceiver and transmitter. In one aspect, the at least one electronic component includes one or more of the receiver, transceiver and transmitter.

Another innovative aspect of the subject matter described in this disclosure can be implemented as a method of manufacturing a display device that includes etching a recess into a backplate; depositing a conductive seed layer on the backplate, applying a resist pattern, etching the conductive seed layer and stripping the resist pattern from the backplate; plating the etched backplate pattern to form electrical traces from integrated circuit mounting pads within the etched recess to conductive pads outside the etched recess; and mounting one or more integrated circuits to the mounting pads on the backplate. In one aspect, etching a recess includes etching a recess into a glass backplate. In another aspect, depositing the conductive seed layer includes depositing a layer of aluminum. In an aspect, depositing the conductive seed layer includes one or more of colloidal metal aerosols, jet dispensed paste, sputter deposition (PVD), chemical vapor deposition (CVD), atomic layer deposition (ALD) and evaporation. In one aspect, plating the etched backplate includes electroless plating. In yet another aspect, mounting one or more electrical components within the recess includes mounting a display driver circuit.

Still another innovative aspect of the subject matter described in this disclosure can be implemented as a method of manufacturing a display device that includes providing a backplate having a recess and one or more electrical traces that run from electrical component mounting pads in the recess to one or more conductive pads on the backplate and mounting at least one electrical component onto the mounting pads. The method further includes providing a substrate having an electromechanical device, one or more connection pads and one or more external pads, where the one or more connection pads are electrically connected to the external pads and sealing the substrate to the backplate to form a package where the one or more conductive pads are electrically connected to the one or more connection pads, and where the electromechanical device and at least one of the connection pads are internal to the seal and the external pads are external to the seal.

In one aspect of the method, providing the recessed backplate includes forming the one or more electrical traces on the backplate. In one aspect of the method, providing a substrate having an electromechanical device includes providing a substrate having an interferometric modulator device. In another aspect of the method, mounting the at least one electrical component includes mounting a display driver circuit. In some aspects of the method, the pad is electrically connected to the one or more connection pads by electrical traces that may be integrated into the substrate. In one aspect of the method, providing a substrate having one or more pads includes providing a substrate having one or more flex pads.

A further innovative aspect of the subject matter described in this disclosure can be implemented in an electronic display device that has a backplate having a recess. In this aspect the electronic display device also includes at least one electrical component mounted in the recess that is in electrical communication with one or more upper electrical traces extending from the integrated electrical component to one or more conductive pads on the backplate. The electronic device also includes a substrate having one or more electromechanical devices and means for sealing configured to circumscribe the one or more electromechanical devices and adhere the backplate and the substrate to each other and provide for a sealed area. In addition, the electronic device has one or more pads outside the sealed area and a means for electrically connecting the one or more conductive pads on the backplate to the one or more pads outside the seal. In one aspect, the means for electrically connecting is a conductive trace. In another aspect, the conductive trace runs underneath the seal. In an aspect, the conductive trace is integrated into the substrate.

In one aspect, a recessed backplate is attached to a substrate. The recessed backplate serves as a substrate for one or more passive devices. A device is attached inside a recess on the backplate and electrically connected to two or more leads. At least one of the two or more leads is electrically connected to the one or more passive devices and at least one of the two or more leads is electrically connected to a connection pad on the substrate. In one aspect of the electronic display device, the substrate is a printed circuit board. In one aspect of the device, the recessed backplate is formed of glass. In one aspect of the device, the device attached to the backplate is at least one of an application specific electrical component, a transceiver, a power management electrical component and a microelectromechanical system. In one aspect, the one or more passive elements include one or more of a capacitor, an inductor, a resistor and a resonator.

Details of one or more implementations of the subject matter described in this specification are set forth in the accompanying drawings and the description below. Although the examples provided in this disclosure are primarily described in terms of electromechanical systems (EMS) and microelectromechanical systems (MEMS)-based displays, the concepts provided herein may apply to other types of displays, such as liquid crystal displays, organic light-emitting diode ("OLED") displays and field emission displays. Other features, aspects and advantages will become apparent from the description, the drawings and the claims. Note that the relative dimensions of the following figures may not be drawn to scale.

BRIEF DESCRIPTION OF THE DRAWINGS

Like reference numbers and designations in the various drawings indicate like elements.

DETAILED DESCRIPTION

Figure 1A:
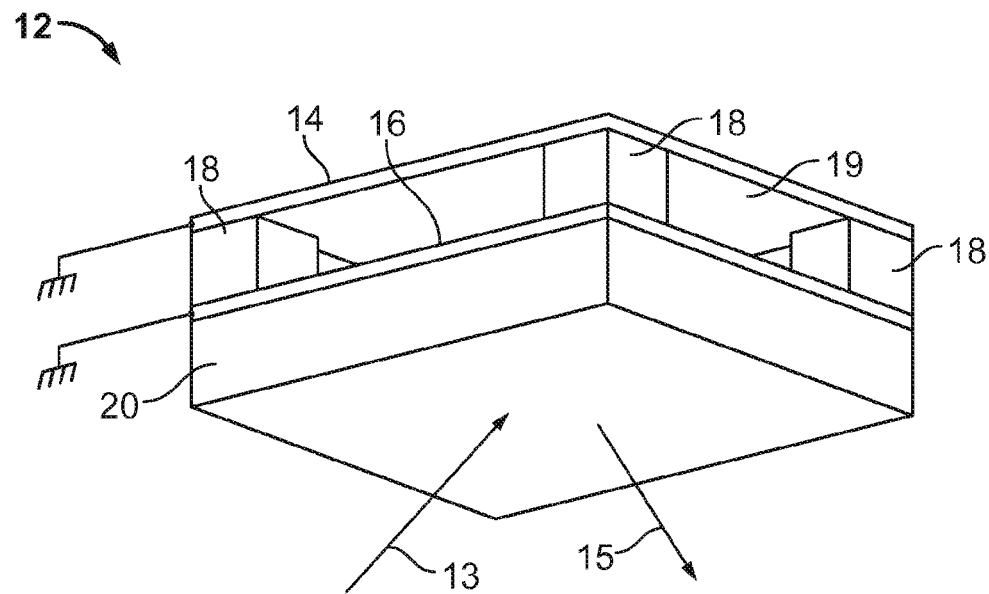
FIGS. 1A and 1B show examples of isometric views depicting a pixel of an interferometric modulator (IMOD) display device in two different states.

The following description is directed to certain implementations for the purposes of describing the innovative aspects of this disclosure. However, a person having ordinary skill in the art will readily recognize that the teachings herein can be applied in a multitude of different ways. The described implementations may be implemented in any device or system that can be configured to display an image, whether in motion (e.g., video) or stationary (e.g., still image), and whether textual, graphical or pictorial. More particularly, it is contemplated that the described implementations may be included in or associated with a variety of electronic devices such as, but not limited to: mobile telephones, multimedia Internet enabled cellular telephones, mobile television receivers, wireless devices, smartphones, Bluetooth® devices, personal data assistants (PDAs), wireless electronic mail receivers, hand-held or portable computers, netbooks, notebooks, smartbooks, tablets, printers, copiers, scanners, facsimile devices, GPS receivers/navigators, cameras, MP3 players, camcorders, game consoles, wrist watches, clocks, calculators, television monitors, flat panel displays, electronic reading devices (i.e., e-readers), computer monitors, auto displays (including odometer and speedometer displays, etc.), cockpit controls and/or displays, camera view displays (such as the display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (such as in electromechanical systems (EMS), microelectromechanical systems (MEMS) and non-MEMS applications), aesthetic structures (e.g., display of images on a piece of jewelry) and a variety of EMS devices. The teachings herein also can be used in non-display applications such as, but not limited to, electronic switching devices, radio frequency filters, sensors, accelerometers, gyroscopes, motion-sensing devices, magnetometers, inertial components for consumer electronics, parts of consumer electronics products, varactors, liquid crystal devices, electrophoretic devices, drive schemes, manufacturing processes and electronic test equipment. Thus, the teachings are not intended to be limited to the implementations depicted solely in the Figures, but instead have wide applicability as will be readily apparent to one having ordinary skill in the art.

The systems and methods disclosed herein are generally applicable to electromechanical systems (EMS) devices that connect internal integrated circuits to internal and external devices. For example, one aspect relates to manufacturing display devices, such as IMOD displays, having internal integrated circuits within a recess on an interior surface of a backplate. In order to connect the internal integrated circuit to a device that is external to the display device, electrical connection traces are run from the internal integrated circuit to peripheral positions on a backplate. Those peripheral positions are aligned with connection pads on the lower substrate so that when the display device is assembled the peripheral positions on the backplate make a connection to corresponding connection pads on the lower substrate. This configuration allows signals from the internal integrated circuit to be routed to connections on the lower substrate. Once the connections are made to the lower substrate, they can be routed to a display device, such as an interferometric modulator array.

Alternatively, the connections can be routed to devices external to the display package by being connected to pads that run underneath or adjacent to a sealing ring that circumscribes the internal display device thus providing a means for electrically connecting the conductive pads on the backplate to a pad that is exterior to the seal. In some implementations, the display device is made with a sealing ring surrounding the components contained in a display recess. Thus, the pads can be configured to run below this sealing ring in order to provide a signal trace to the external environment, but still maintain a hermetic or semi-hermetic seal within the display package. A person having ordinary skill in the art will readily appreciate that the techniques disclosed herein may be applicable to packages other than displays where substrates are joined to form the unit.

Particular implementations of the subject matter described in this disclosure can be implemented to realize one or more of the following potential advantages. Because the driver circuitry is internal to the display package, the borders of the device can be less than 1 millimeter thick on each side. Also, because traces are formed on the recess of the backplate several additional advantages are realized. For example, using the recess as a mounting site increases the available area for including integrated circuits into the package. The integrated circuits in the recess can be connected to elements outside the package by traversing the sealing ring on one side. Because the device can traverse the seal on one side, it is possible to optimize this connection, for example by traversing under the sealing ring. Connecting the circuitry inside of the package to an external connection pad using a conducting via passing under the sealing ring can provide a more reliable seal for the package. Additionally, this provides a narrow seal width (such as less than 1 millimeter) on three of the four sides of the package.

An example of a suitable EMS or MEMS device, to which the described implementations may apply, is a reflective display device. Reflective display devices can incorporate interferometric modulators (IMODs) to selectively absorb and/or reflect light incident thereon using principles of optical interference. IMODs can include an absorber, a reflector that is movable with respect to the absorber, and an optical resonant cavity defined between the absorber and the reflector. The reflector can be moved to two or more different positions, which can change the size of the optical resonant cavity and thereby affect the reflectance of the interferometric modulator. The reflectance spectrums of IMODs can create fairly broad spectral bands which can be shifted across the visible wavelengths to generate different colors. The position of the spectral band can be adjusted by changing the thickness of the optical resonant cavity, i.e., by changing the position of the reflector.

Figure 1B:
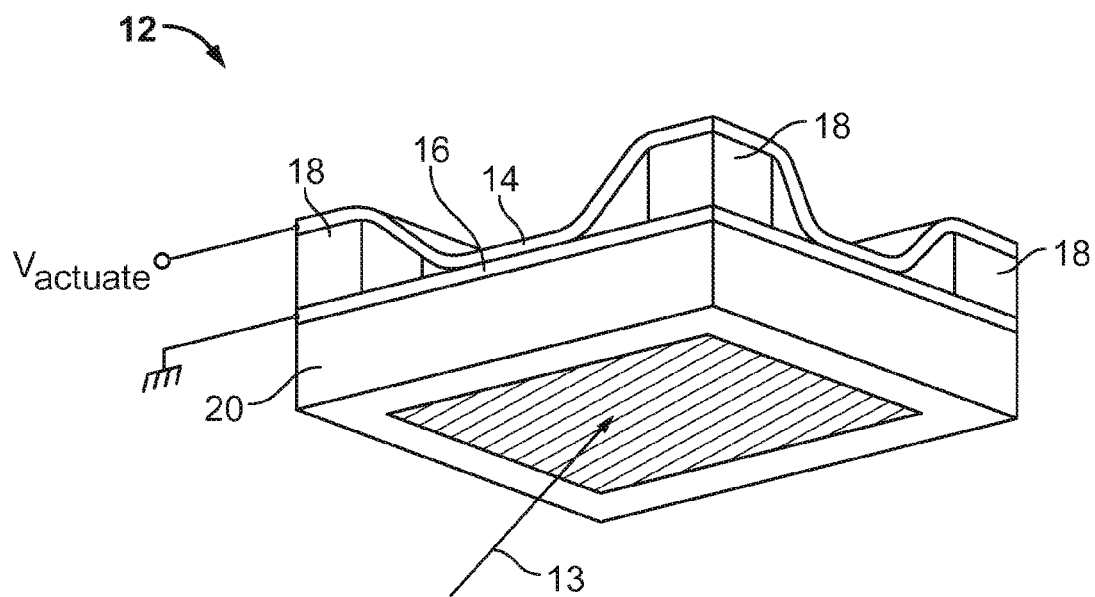

FIGS. 1A and 1B show examples of isometric views depicting a pixel of an interferometric modulator (IMOD) display device in two different states. The IMOD display device includes one or more interferometric MEMS display elements. In these devices, the pixels of the MEMS display elements can be in either a bright or dark state. In the bright ("relaxed," "open" or "on") state, the display element reflects a large portion of incident visible light, e.g., to a user. Conversely, in the dark ("actuated," "closed" or "off") state, the display element reflects little incident visible light. In some implementations, the light reflectance properties of the on and off states may be reversed. MEMS pixels can be configured to reflect predominantly at particular wavelengths allowing for a color display in addition to black and white.

The IMOD display device can include a row/column array of IMODs. Each IMOD can include a pair of reflective layers, i.e., a movable reflective layer and a fixed partially reflective layer, positioned at a variable and controllable distance from each other to form an air gap (also referred to as an optical gap or cavity). The movable reflective layer may be moved between at least two positions. In a first position, i.e., a relaxed position, the movable reflective layer can be positioned at a relatively large distance from the fixed partially reflective layer. In a second position, i.e., an actuated position, the movable reflective layer can be positioned more closely to the partially reflective layer. Incident light that reflects from the two layers can interfere constructively or destructively depending on the position of the movable reflective layer, producing either an overall reflective or non-reflective state for each pixel. In some implementations, the IMOD may be in a reflective state when unactuated, reflecting light within the visible spectrum, and may be in a dark state when unactuated, reflecting light outside of the visible range (such as infrared light). In some other implementations, however, an IMOD may be in a dark state when unactuated, and in a reflective state when actuated. In some implementations, the introduction of an applied voltage can drive the pixels to change states. In some other implementations, an applied charge can drive the pixels to change states.

The depicted pixels in FIGS. 1A and 1B depict two different states of an IMOD 12. In the IMOD 12 in FIG. 1A, a movable reflective layer 14 is illustrated in a relaxed position at a predetermined (e.g., designed) distance from an optical stack 16, which includes a partially reflective layer. Since no voltage is applied across the IMOD 12 in FIG. 1A, the movable reflective layer 14 remained in a relaxed or unactuated state. In the IMOD 12 in FIG. 1B, the movable reflective layer 14 is illustrated in an actuated position and adjacent, or nearly adjacent, to the optical stack 16. The voltage $V_{actuate}$ applied across the IMOD 12 in FIG. 1B is sufficient to actuate the movable reflective layer 14 to an actuated position.

In FIGS. 1A and 1B, the reflective properties of pixels 12 are generally illustrated with arrows 13 indicating light incident upon the pixels 12, and light 15 reflecting from the pixel 12 on the left. Although not illustrated in detail, it will be understood by a person having ordinary skill in the art that most of the light 13 incident upon the pixels 12 will be transmitted through the transparent substrate 20, toward the optical stack 16. A portion of the light incident upon the optical stack 16 will be transmitted through the partially reflective layer of the optical stack 16, and a portion will be reflected back through the transparent substrate 20. The portion of light 13 that is transmitted through the optical stack 16 will be reflected at the movable reflective layer 14, back toward (and through) the transparent substrate 20. Interference (constructive or destructive) between the light reflected from the partially reflective layer of the optical stack 16 and the light reflected from the movable reflective layer 14 will determine the wavelength(s) of light 15 reflected from the pixels 12.

The optical stack 16 can include a single layer or several layers. The layer(s) can include one or more of an electrode layer, a partially reflective and partially transmissive layer and a transparent dielectric layer. In some implementations, the optical stack 16 is electrically conductive, partially transparent and partially reflective, and may be fabricated, for example, by depositing one or more of the above layers onto a transparent substrate 20. The electrode layer can be formed from a variety of materials, such as various metals, for example indium tin oxide (ITO). The partially reflective layer can be formed from a variety of materials that are partially reflective, such as various metals (such as chromium (Cr)), semiconductors and dielectrics. The partially reflective layer can be formed of one or more layers of materials, and each of the layers can be formed of a single material or a combination of materials. In some implementations, the optical stack 16 can include a single semi-transparent thickness of metal or semiconductor which serves as both an optical absorber and conductor, while different, more conductive layers or portions (for example, of the optical stack 16 or of other structures of the IMOD) can serve to bus signals between IMOD pixels. The optical stack 16 also can include one or more insulating or dielectric layers covering one or more conductive layers or a conductive/absorptive layer.

In some implementations, the optical stack 16, or lower electrode, is grounded at each pixel. In some implementations, this may be accomplished by depositing a continuous optical stack 16 onto the substrate 20 and grounding at least a portion of the continuous optical stack 16 at the periphery of the deposited layers. In some implementations, a highly conductive and reflective material, such as aluminum (Al), may be used for the movable reflective layer 14. The movable reflective layer 14 may be formed as a metal layer or layers deposited on top of posts 18 and an intervening sacrificial material deposited between the posts 18. When the sacrificial material is etched away, a defined gap 19, or optical cavity, can be formed between the movable reflective layer 14 and the optical stack 16. In some implementations, the spacing between posts 18 may be approximately 1-1,000 um, while the gap 19 may be less than 10,000 Angstroms (Å).

In some implementations, each pixel of the IMOD, whether in the actuated or relaxed state, is essentially a capacitor formed by the fixed and moving reflective layers. When no voltage is applied, the movable reflective layer 14 remains in a mechanically relaxed state, as illustrated by the pixel 12 in FIG. 1A, with the gap 19 between the movable reflective layer 14 and optical stack 16. However, when a potential difference, e.g., voltage, is applied to at least one of the movable reflective layer 14 and optical stack 16, the capacitor formed at the corresponding pixel becomes charged, and electrostatic forces pull the electrodes together. If the applied voltage exceeds a threshold, the movable reflective layer 14 can deform and move near or against the optical stack 16. A dielectric layer (not shown) within the optical stack 16 may prevent shorting and control the separation distance between the layers 14 and 16, as illustrated by the actuated pixel 12 in FIG. 1B. The behavior is the same regardless of the polarity of the applied potential difference. Though a series of pixels in an array may be referred to in some instances as "rows" or "columns," a person having ordinary skill in the art will readily understand that referring to one direction as a "row" and another as a "column" is arbitrary. Restated, in some orientations, the rows can be considered columns, and the columns considered to be rows. Furthermore, the display elements may be evenly arranged in orthogonal rows and columns (an "array"), or arranged in non-linear configurations, for example, having certain positional offsets with respect to one another (a "mosaic"). The terms "array" and "mosaic" may refer to either configuration. Thus, although the display is referred to as including an "array" or "mosaic," the elements themselves need not be arranged orthogonally to one another, or disposed in an even distribution, in any instance, but may include arrangements having asymmetric shapes and unevenly distributed elements.

In some implementations, such as in a series or array of IMODs, the optical stacks 16 can serve as a common electrode that provides a common voltage to one side of the IMODs 12. The movable reflective layers 14 may be formed as an array of separate plates arranged in, for example, a matrix form. The separate plates can be supplied with voltage signals for driving the IMODs 12.

Figure 3:
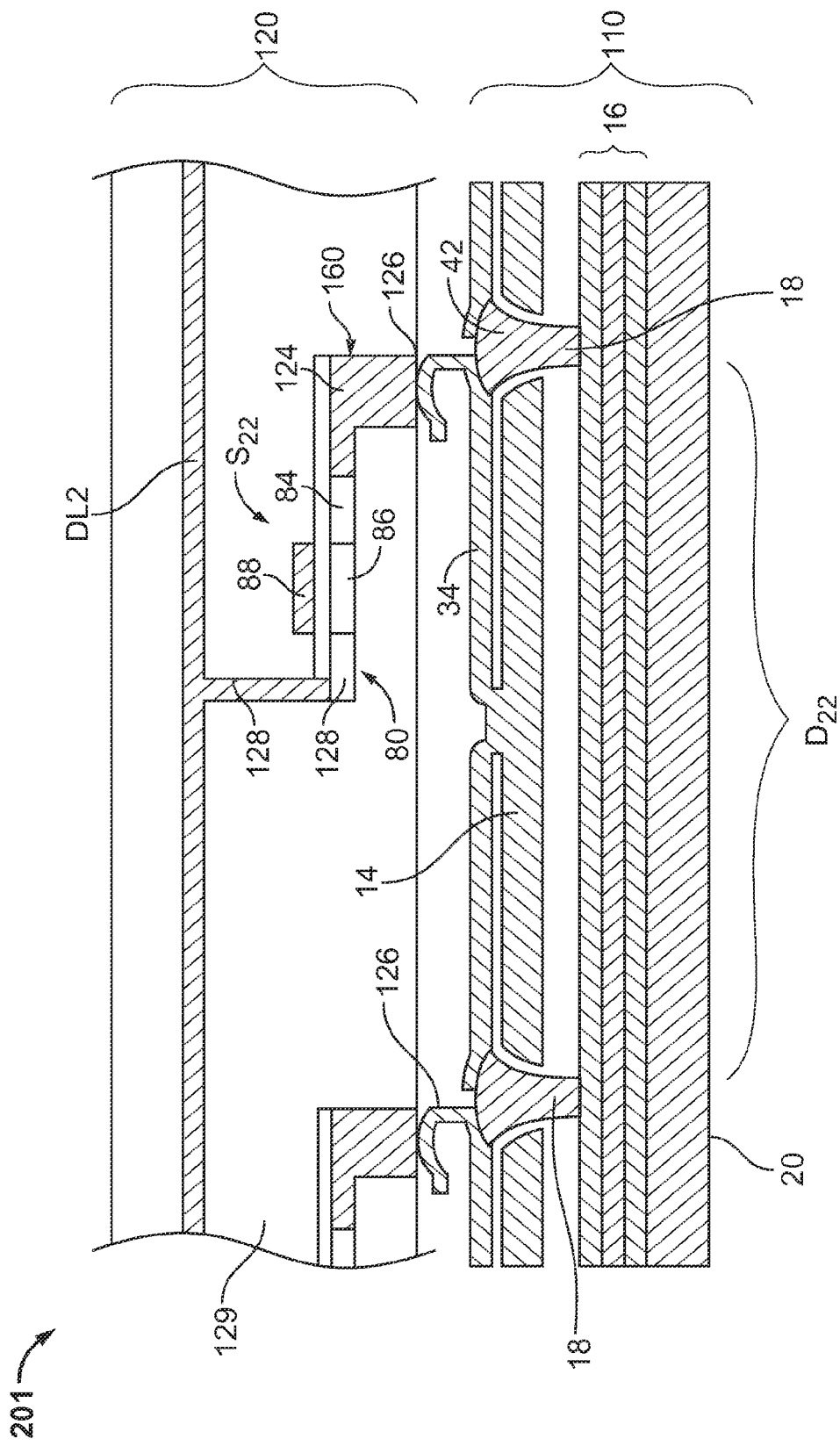
FIG. 3 is an example of a schematic partial cross-section illustrating one implementation of the structure of the driving circuit and the associated display element of FIG. 2.

The details of the structure of interferometric modulators that operate in accordance with the principles set forth above may vary widely. For example, the movable reflective layers 14 of each IMOD 12 may be attached to supports at the corners only, for example, on tethers. As shown in FIG. 3, a flat, relatively rigid movable reflective layer 14 may be suspended from a deformable layer 34, which may be formed from a flexible metal. This architecture allows the structural design and materials used for the electromechanical aspects and the optical aspects of the modulator to be selected, and to function, independently of each other. Thus, the structural design and materials used for the movable reflective layer 14 can be optimized with respect to the optical properties, and the structural design and materials used for the deformable layer 34 can be optimized with respect to desired mechanical properties. For example, the movable reflective layer 14 portion may be Al, and the deformable layer 34 portion may be nickel (Ni). The deformable layer 34 may connect, directly or indirectly, to the substrate 20 around the perimeter of the deformable layer 34. These connections may form the support posts 18.

In implementations such as those shown in FIGS. 1A and 1B, the IMODs function as direct-view devices, in which images are viewed from the front side of the transparent substrate 20, i.e., the side opposite to that upon which the modulator is arranged. In these implementations, the back portions of the device (that is, any portion of the display device behind the movable reflective layer 14, including, for example, the deformable layer 34 illustrated in FIG. 3) can be configured and operated upon without impacting or negatively affecting the image quality of the display device, because the reflective layer 14 optically shields those portions of the device. For example, in some implementations a bus structure (not illustrated) can be included behind the movable reflective layer 14 which provides the ability to separate the optical properties of the modulator from the electromechanical properties of the modulator, such as voltage addressing and the movements that result from such addressing.

Figure 2:
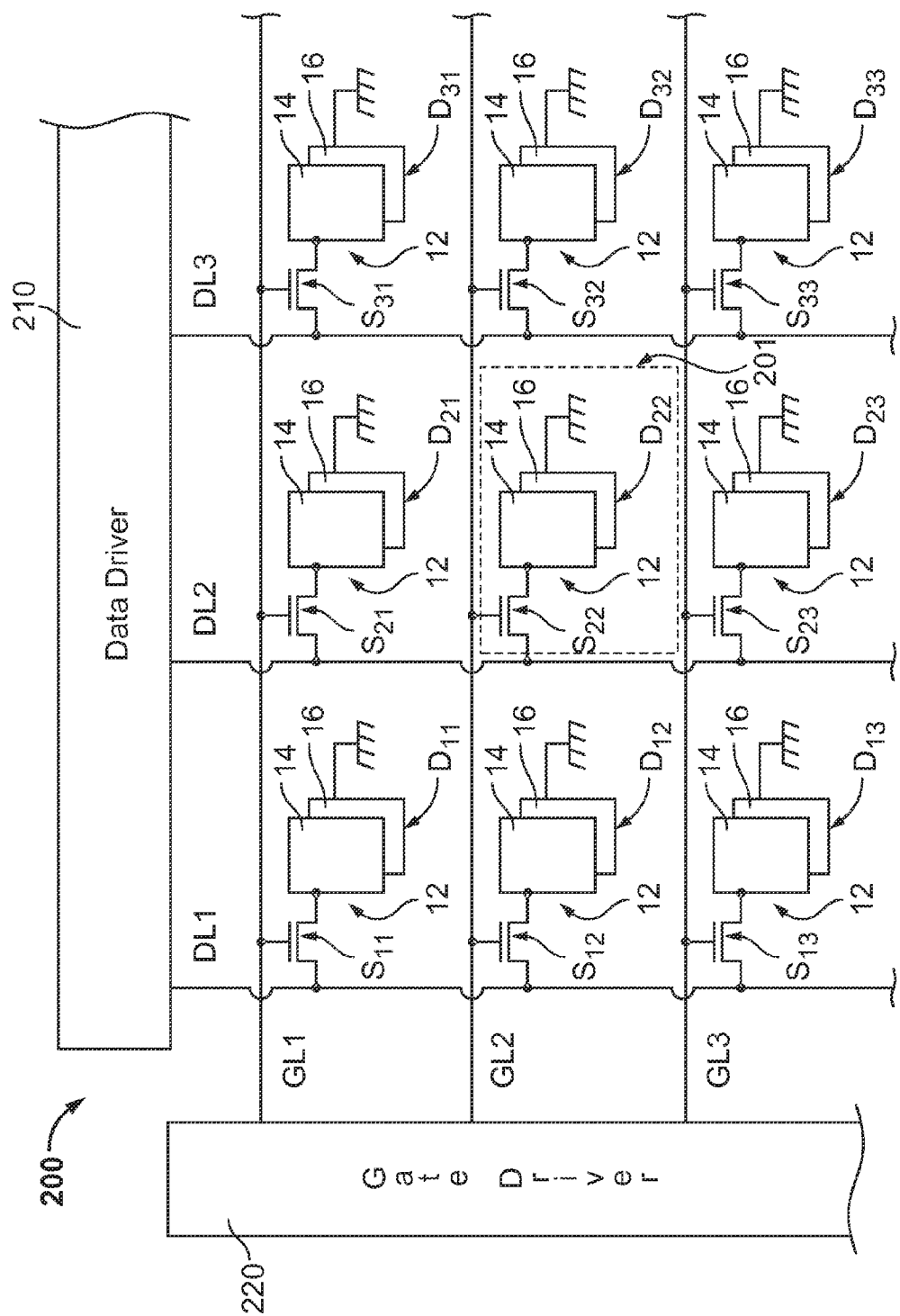
FIG. 2 shows an example of a schematic circuit diagram illustrating a driving circuit array for an optical MEMS display device.

FIG. 2 shows an example of a schematic circuit diagram illustrating a driving circuit array for an optical MEMS display device. A driving circuit array 200 can be used for implementing an active matrix addressing scheme for providing image data to display elements $D_{11}$-$D_{mn}$ of a display array assembly.

The driving circuit array 200 includes a data driver 210, a gate driver 220, first to m-th data lines DL1-DLm, first to n-th gate lines GL1-GLn, and an array of switches or switching circuits $S_{11}$-$S_{mn}$. Each of the data lines DL1-DLm extends from the data driver 210, and is electrically connected to a respective column of switches $S_{11}$-$S_{1n}$, $S_{21}$-$S_{2n}$, ... $S_{m1}$-$S_{mn}$. Each of the gate lines GL1-GLn extends from the gate driver 220, and is electrically connected to a respective row of switches $S_{11}$-$S_{m1}$, $S_{12}$-$S_{m2}$, ..., $S_{1n}$-$S_{mn}$. The switches $S_{11}$-$S_{mn}$ are electrically coupled between one of the data lines DL1-DLm and a respective one of the display elements $D_{11}$-$D_{mn}$ and receive a switching control signal from the gate driver 220 via one of the gate lines GL1-GLn. The switches $S_{11}$-$S_{mn}$ are illustrated as single FET transistors, but may take a variety of forms such as two transistor transmission gates (for current flow in both directions) or even mechanical MEMS switches.

The data driver 210 can receive image data from outside the display, and can provide the image data on a row by row basis in a form of voltage signals to the switches $S_{11}$-$S_{mn}$ via the data lines DL1-DLm. The gate driver 220 can select a particular row of display elements $D_{11}$-$D_{m1}$, $D_{12}$-$D_{m2}$, ..., $D_{1n}$-$D_{mn}$ by turning on the switches $S_{11}$-$S_{m1}$, $S_{12}$-$S_{m2}$, ..., $S_{1n}$-$S_{mn}$ associated with the selected row of display elements $D_{11}$-$D_{m1}$, $D_{12}$-$D_{m2}$, ..., $D_{1n}$-$D_{mn}$. When the switches $S_{11}$-$S_{m1}$, $S_{12}$-$S_{m2}$, ..., $S_{1n}$-$S_{mn}$ in the selected row are turned on, the image data from the data driver 210 is passed to the selected row of display elements $D_{11}$-$D_{m1}$, $D_{12}$-$D_{m2}$, ..., $D_{1n}$-$D_{mn}$.

During operation, the gate driver 220 can provide a voltage signal via one of the gate lines GL1-GLn to the gates of the switches $S_{11}$-$S_{mn}$ in a selected row, thereby turning on the switches $S_{11}$-$S_{mn}$. After the data driver 210 provides image data to all of the data lines DL1-DLm, the switches $S_{11}$-$S_{mn}$ of the selected row can be turned on to provide the image data to the selected row of display elements $D_{11}$-$D_{m1}$, $D_{12}$-$D_{m2}$, ..., $D_{1n}$-$D_{mn}$, thereby displaying a portion of an image. For example, data lines DL that are associated with pixels that are to be actuated in the row can be set to, for example, 10 volts (could be positive or negative), and data lines DL that are associated with pixels that are to be released in the row can be set to, for example, 0 volts. Then, the gate line GL for the given row is asserted, turning the switches in that row on, and applying the selected data line voltage to each pixel of that row. This charges and actuates the pixels that have 10 volts applied, and discharges and releases the pixels that have 0 volts applied. Then, the switches $S_{11}$-$S_{mn}$ can be turned off. The display elements $D_{11}$-$D_{m1}$, $D_{12}$-$D_{m2}$, ..., $D_{1n}$-$D_{mn}$ can hold the image data because the charge on the actuated pixels will be retained when the switches are off, except for some leakage through insulators and the off state switch. Generally, this leakage is low enough to retain the image data on the pixels until another set of data is written to the row. These steps can be repeated to each succeeding row until all of the rows have been selected and image data has been provided thereto. In the implementation of FIG. 2, the optical stack 16 is grounded at each pixel. In some implementations, this may be accomplished by depositing a continuous optical stack 16 onto the substrate and grounding the entire sheet at the periphery of the deposited layers.

FIG. 3 is an example of a schematic partial cross-section illustrating one implementation of the structure of the driving circuit and the associated display element of FIG. 2. A portion 201 of the driving circuit array 200 includes the switch $S_{22}$ at the second column and the second row, and the associated display element $D_{22}$. In the illustrated implementation, the switch $S_{22}$ includes a transistor 80. Other switches in the driving circuit array 200 can have the same configuration as the switch $S_{22}$, or can be configured differently, for example by changing the structure, the polarity, or the material.

FIG. 3 also includes a portion of a display array assembly 110, and a portion of a backplate 120. The portion of the display array assembly 110 includes the display element $D_{22}$ of FIG. 2. The display element $D_{22}$ includes a portion of a front substrate 20, a portion of an optical stack 16 formed on the front substrate 20, supports 18 formed on the optical stack 16, a movable reflective layer 14 (or a movable electrode connected to a deformable layer 34) supported by the supports 18 and an interconnect 126 electrically connecting the movable reflective layer 14 to one or more components of the backplate 120.

The portion of the backplate 120 includes the second data line DL2 and the switch $S_{22}$ of FIG. 2, which are embedded in the backplate 120. The portion of the backplate 120 also includes a first interconnect 128 and a second interconnect 124 at least partially embedded therein. The second data line DL2 extends substantially horizontally through the backplate 120. The switch $S_{22}$ includes a transistor 80 that has a source 82, a drain 84, a channel 86 between the source 82 and the drain 84, and a gate 88 overlying the channel 86. The transistor 80 can be, e.g., a thin film transistor (TFT) or metal-oxide-semiconductor field effect transistor (MOSFET). The gate of the transistor 80 can be formed by gate line GL2 extending through the backplate 120 perpendicular to data line DL2. The first interconnect 128 electrically couples the second data line DL2 to the source 82 of the transistor 80.

The transistor 80 is coupled to the display element $D_{22}$ through one or more vias 160 through the backplate 120. The vias 160 are filled with conductive material to provide electrical connection between components (for example, the display element $D_{22}$) of the display array assembly 110 and components of the backplate 120. In the illustrated implementation, the second interconnect 124 is formed through the via 160, and electrically couples the drain 84 of the transistor 80 to the display array assembly 110. The backplate 120 also can include one or more insulating layers 129 that electrically insulate the foregoing components of the driving circuit array 200.

The optical stack 16 of FIG. 3 is illustrated as three layers, a top dielectric layer described above, a middle partially reflective layer (such as chromium) also described above, and a lower layer including a transparent conductor (such as indium-tin-oxide (ITO)). The common electrode is formed by the ITO layer and can be coupled to ground at the periphery of the display. In some implementations, the optical stack 16 can include more or fewer layers. For example, in some implementations, the optical stack 16 can include one or more insulating or dielectric layers covering one or more conductive layers or a combined conductive/absorptive layer.

Figure 4:
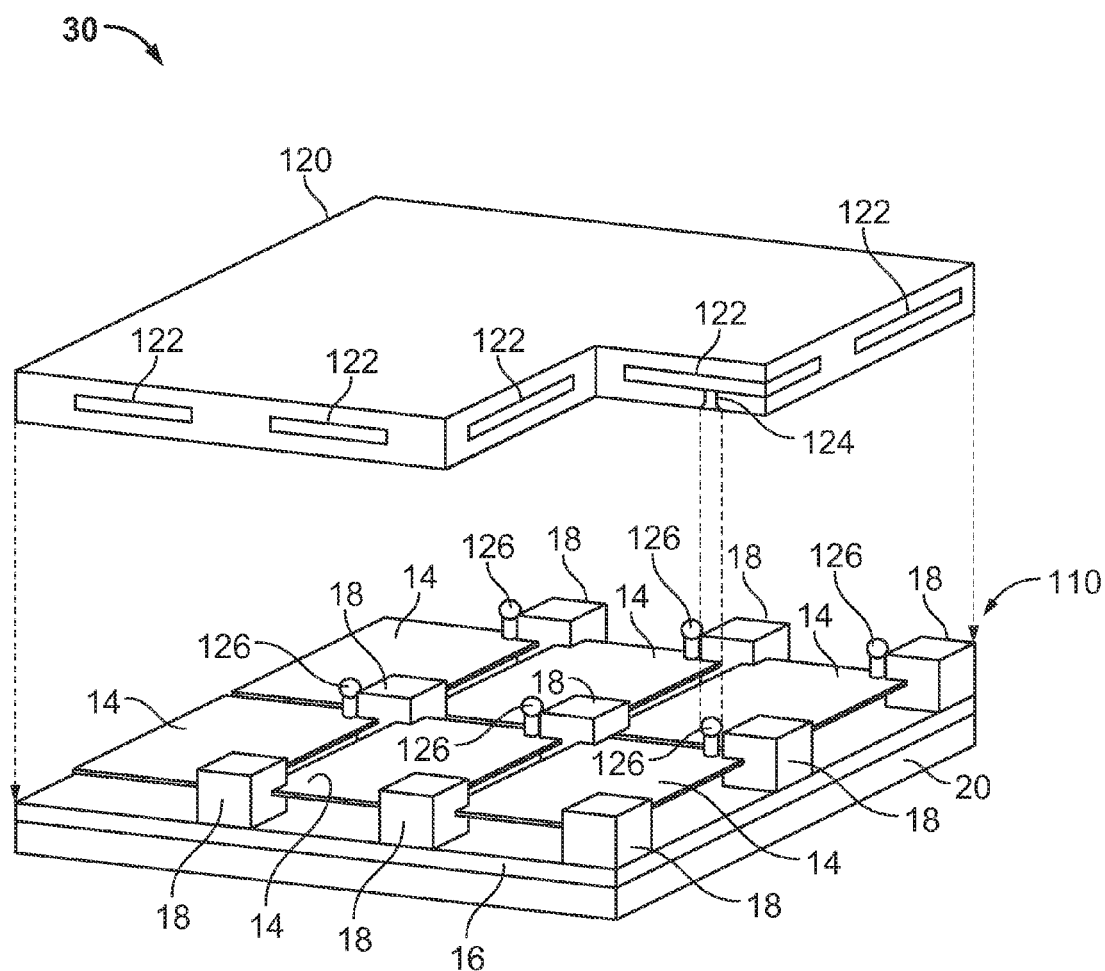
FIG. 4 is an example of a schematic exploded partial perspective view of an optical MEMS display device having an interferometric modulator array and a backplate with embedded circuitry.

FIG. 4 is an example of a schematic exploded partial perspective view of an optical MEMS display device having an interferometric modulator array and a backplate with embedded circuitry. A display device 30 includes a display array assembly 110 and a backplate 120. In some implementations, the display array assembly 110 and the backplate 120 can be separately pre-formed before being attached together. In some other implementations, the display device 30 can be fabricated in any suitable manner, such as, by forming components of the backplate 120 over the display array assembly 110 by deposition.

The display array assembly 110 can include a front substrate 20, an optical stack 16, supports 18, a movable reflective layer 14 and interconnects 126. The backplate 120 can include backplate components 122 at least partially embedded therein and one or more backplate interconnects 124.

The optical stack 16 of the display array assembly 110 can be a substantially continuous layer covering at least the array region of the front substrate 20. The optical stack 16 can include a substantially transparent conductive layer that is electrically connected to ground. The reflective layers 14 can be separate from one another and can have, for example, a square or rectangular shape. The movable reflective layers 14 can be arranged in a matrix form such that each of the movable reflective layers 14 can form part of a display element. In the implementation illustrated in FIG. 4, the movable reflective layers 14 are supported by the supports 18 at four corners.

Each of the interconnects 126 of the display array assembly 110 serves to electrically couple a respective one of the movable reflective layers 14 to one or more backplate components 122 (for example, transistors and/or other passive or active circuit elements). In the illustrated implementation, the interconnects 126 of the display array assembly 110 extend from the movable reflective layers 14, and are positioned to contact the backplate interconnects 124. In another implementation, the interconnects 126 of the display array assembly 110 can be at least partially embedded in the supports 18 while being exposed through top surfaces of the supports 18. In such an implementation, the backplate interconnects 124 can be positioned to contact exposed portions of the interconnects 126 of the display array assembly 110. In yet another implementation, the backplate interconnects 124 can extend from the backplate 120 toward the movable reflective layers 14 so as to contact and thereby electrically connect to the movable reflective layers 14.

The interferometric modulators described above have been described as bi-stable elements having a relaxed state and an actuated state. The above and following description, however, also may be used with analog interferometric modulators having a range of states. For example, an analog interferometric modulator can have a red state, a green state, a blue state, a black state and a white state, in addition to other color states. Accordingly, a single interferometric modulator can be configured to have various states with different light reflectance properties over a wide range of the optical spectrum.

Figure 5A:
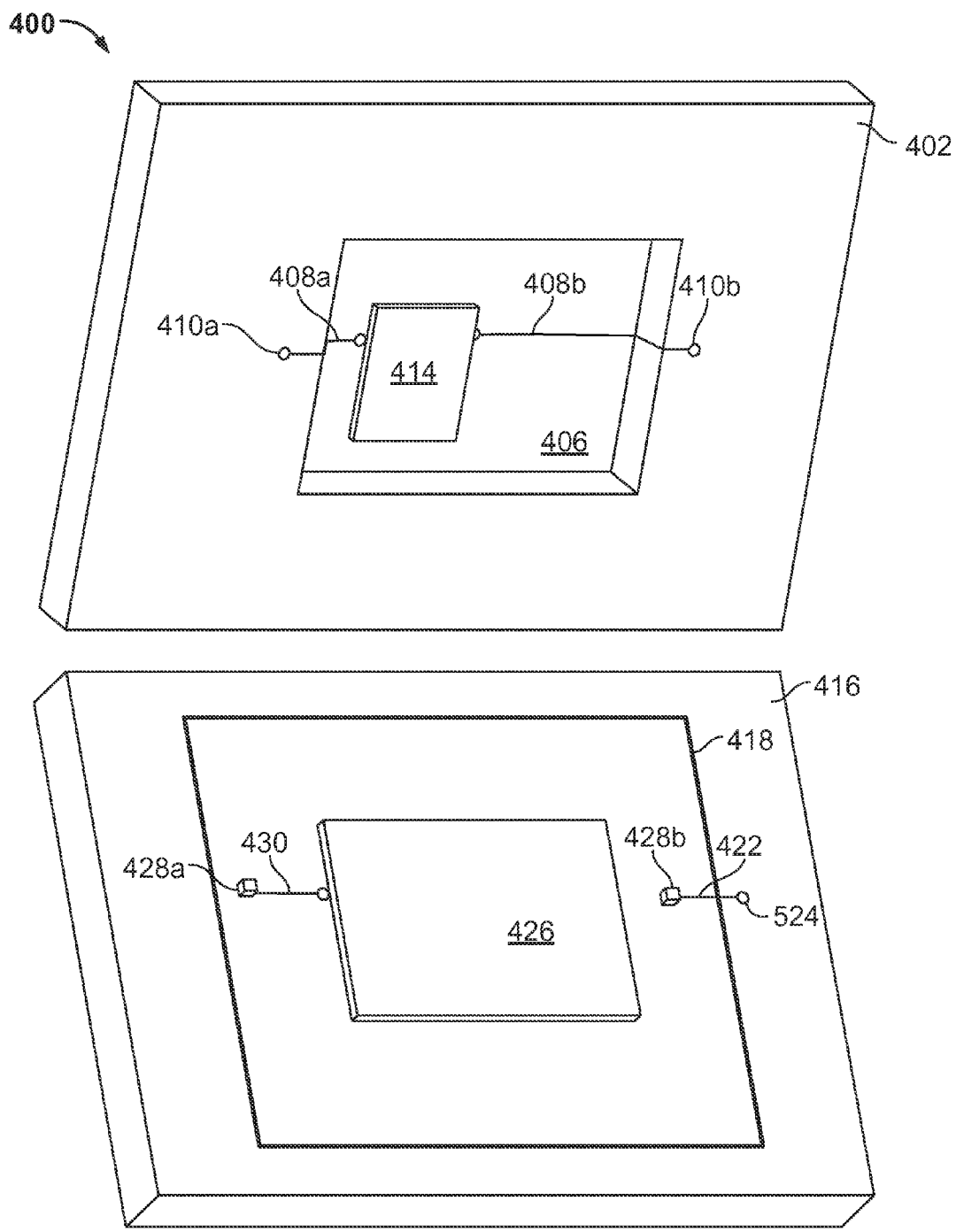
FIGS. 5A and 5B are perspective views of examples of devices including a backplate and a substrate.
Figure 5B:
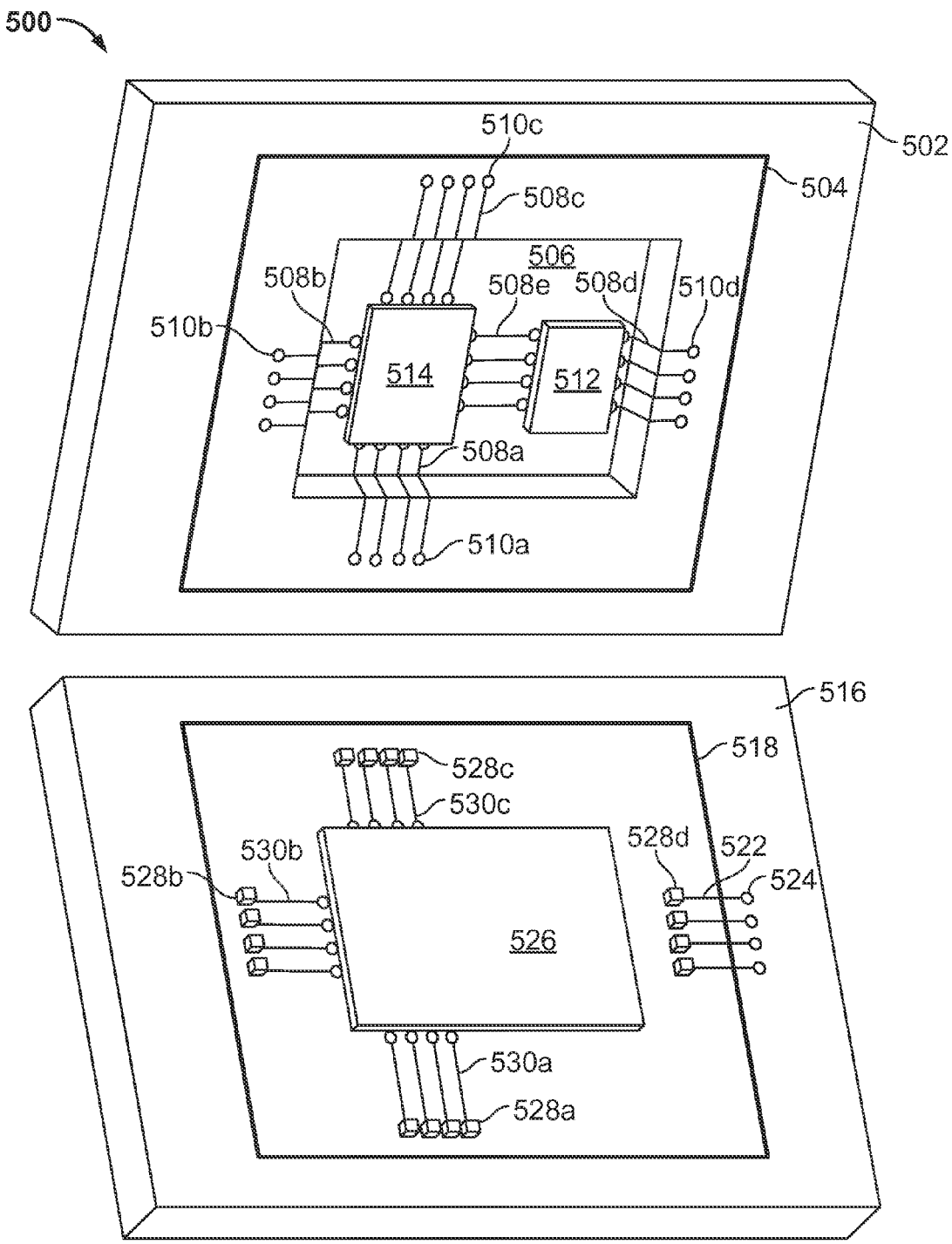

FIGS. 5A and 5B are perspective views of examples of devices including a backplate and a substrate. In FIG. 5A, a device 400 has a backplate 402. The backplate 402 includes a recess 406 that includes an integrated circuit 414. The integrated circuit 414 is connected via traces 408a and 408b to connection pads 410a and 410b, respectively that are outside the recess 406. In some implementations, one or both of the connection pads 410a and 410b may be formed within the recess 406. The device 400 also has a substrate 416 that is shown as supporting an EMS device 426. In addition, the substrate 416 may include a seal 418 which circumscribes the EMS device 426 to form a hermetic cavity when the backplate 402 is sealed to the seal 418. The EMS device 426 is connected via a trace 430 to a connection pad 428a. The substrate 416 is also illustrated as having a second connection pad 428b connected via a trace 422 to a pad 424 on an outer portion of the seal 418.

The backplate 402 may be joined to the substrate 416 through the seal 418 such that an electrical path is formed by contacting the connection pad 410b on the backplate 402 with the connection pad 428b on the substrate 416. This electrical path allows signals to be transmitted to and from the integrated circuit 414 to an exterior device connected to the pad 424. For example, a control signal received at the pad 424 may be transmitted underneath the seal 418 to the connection pad 428b. Because the connection pad 428b joins to the connection pad 410b when the device 400 is sealed, the signal may continue along trace 408b to the integrated circuit 414. In addition, a signal from the integrated circuit 414 may be sent along the trace 408a to the connection pad 410a. If the backplate 402 is sealed to the substrate 416, then the connection pad 410a makes an electrical connection to the connection pad 428a which allows a signal to pass through the trace 430 to the EMS device 426. In some implementations, a signal may originate from the integrated circuit 414 and propagate to the coupled components, such as an EMS device 426 or to a device electrically connected to the pad 424. In some implementations, a signal may originate from the EMS device 426 and propagate to the integrated circuit 414. In some implementations, the backplate 402 includes multiple integrated circuit components (not shown) similar to the integrated circuit 414.

FIG. 5B is a perspective view of another example of a device including a backplate and a substrate. In one aspect, a backplate 502 is an etchable, transparent substrate, such as plastic or glass. In some implementations, the backplate 502 is a cover layer. In some implementations, the backplate 502 is semi-transparent or opaque. The backplate 502 includes a recess 506 that may be wet etched into the backplate or formed through other appropriate means to produce a recessed surface in the recess 506. Based on the particular design, the recess 506 may be implemented having a variety of depths, such as a few microns to hundreds of microns, for example 100-200 microns. In some implementations, the recess 506 is generally concave in shape, including a flat portion at the apex. According to some other implementations, the backplate 502 may include a plurality of cavities 506. FIG. 5B shows an implementation including a recess 506 having a generally square shape. In another implementation, the recess 506 may be round in shape. In yet another implementation, the recess 506 may be an irregular shape to accommodate asymmetrical components.

The inside of the recess 506 can include at least one integrated circuit 514. The integrated circuit 514 is placed into the recess 506 such that the integrated circuit 514 does not extend beyond the surface of the backplate 502. The integrated circuit 514 may be, for example, a MEMS driver circuit, an IMOD driver circuit or a display device driver circuit, in addition to other similar electronics driver circuits. In the implementation shown in FIG. 5B, an additional programmable chip 512 also may be included in the recess 506. Examples of an additional programmable chip 512 include a field programmable gate array (FPGA) or other programmable logic devices (PLD). In some implementations, the additional programmable chip 512 is configured to operate in conjunction with the integrated circuit 514. The recess 506 may include several integrated circuits, limited, for instance, by the available area within the recess 506. In an implementation including multiple cavities 506, the integrated circuits and programmable chips may be arranged amongst the cavities 506. According to another implementation, the recess 506 includes a desiccant (not shown) to control the moisture levels in the device 500. In addition to the integrated circuit 514 and the programmable chip 512, one or more passive elements may be formed on the backplate 502. Passive elements may include capacitors, inductors and resistors, and can be formed onto the backplate 502 by depositing metal patterns onto the backplate 502 directly, where backplate 502 serves as a substrate for the passive elements. In some implementations, the passive elements are formed on a glass backplate. This may eliminate the need for discrete passive elements, and hence may decrease the overall size of the packaged device.

As shown in FIG. 5B, the backplate 502 includes connection pads 510a, 510b, 510c and 510d that are connected to the integrated circuit 514 or the programmable chip 512 through a series of traces 508a-e that run to peripheral positions on the backplate 502. According to some implementations, the connection pads 510a, 510b, 510c and 510d can be raised and formed on the backplate 502 through a process as those shown, for example, in FIG. 7 and described further below. Alternatively the connection pads 510a, 510b, 510c and 510d may be deposited on the backplate 502. The connection pads 510a, 510b, 510c and 510d can be made of electrically conductive material such as copper (Cu) or another conductive alloy. When the backplate 502 is joined to the substrate 516 the connection pads 510a, 510b, 510c and 510d join corresponding connection pads 528a, 528b, 528c and 528d on the backplate 502, forming an electrically conductive connection between respective connections pads.

The conductive traces 508a-e are formed on the backplate 502 through a process such as those shown, for example, in FIG. 7 and described further below. The conductive traces 508a-e can be made of an electrically conductive material including a metal, such as Cu, or a metal or conductive alloy. As discussed above, the conductive traces 508a, 508b and 508c electrically connect the integrated circuit 514 to corresponding connection pads 510a, 510b and 510c. The conductive trace 508d electrically connects the programmable chip 512 to the corresponding connection pads 510d. The conductive trace 508e electrically connects the programmable chip 512 to the integrated circuit 514. In some implementations, conductive traces can extend from only two sides of the integrated circuit 514. In other implementations, conductive traces can be implemented to extend from only one side of the integrated circuit 514. In an implementation where no programmable chip 512 is included, the conductive trace 508d may extend to connect the integrated circuit 514 directly to the connection pad 510d.

The number of conductive traces 508a-e included on the backplate 502 is dependent, in part, on the size and number of pins on the integrated circuit 514 and the programmable chip 512. According to various implementations, the number of conductive traces 508a-e formed on the backplate 502 can be, for example, about fifty, about seventy-five, about one hundred, about five hundred or about one thousand traces, in addition to other numbers of traces, depending on the desired implementation.

As shown in FIG. 5B, the integrated circuit 514, the programmable chip 512, the connection pads 510a-d, the conductive traces 508a-e, and the recess 506 are surrounded by a sealing ring 504. The sealing ring 504 may be formed on the backplate 502 by administration of an adhesive or other sealant that seals the backplate 502 to the substrate 516. In one aspect, a sealing ring 518 also can be applied to the substrate 516, and the combined sealing rings 504 and 518 can be adhered together to provide a protective enclosure for the elements contained within the device 500. In some implementations, the sealing ring 504 or the sealing ring 518 maintains a controlled atmosphere inside the package. In some implementations, the sealing ring 504 or the sealing ring 518 forms a hermetic seal.

With continued reference to FIG. 5B, the substrate 516 includes the connection pads 528a-d that are deposited on the substrate 516 and may be formed from electrically conductive material including a metal, such as Cu, or another metal or conductive alloy. The substrate 516 also includes electrically conductive traces 530a, 530b and 530c. The conductive traces 530a, 530b and 530c electrically connect an EMS device 526 (such as an IMOD) to the raised connection pads 528a, 528b and 528c on three sides of the substrate 516. While the EMS device 526 is shown occupying a relatively small portion of the substrate 516 for ease of illustration of various aspects, in some implementations, the EMS device may occupy a very large portion of the substrate 516. For example, in some implementations, the substrate 516 may include a 150-200 um portion outside of and surrounding the sealing ring 518. The size of the portion surrounding the sealing ring 518 may be selected to accommodate the dicing process required to cut the glass and singulate the individual devices 500. In some implementations, the space on three sides of the device 500 (whether inside the sealing ring 518 or outside) from the edge of the device 500 to the edge of the substrate 516 can be made as small as possible in order to maintain visual aesthetic properties of the device 500. In such an implementation, more space can be provided on a fourth side to allow for connection to the pad 524, for example, to allow for a flex pad to be connected to the pad 524. It is understood that the pad 524 can actually include multiple pads for routing multiple signals.

The connection pad 510d on a fourth side of the substrate 516 is electrically connected to a pad 524 (such as a flex pad) when the device is sealed into a final package. The structure of the pad 524 will be discussed in more detail below. Once the backplate 502 is joined to the substrate 516, the pad 524 is external to the chamber created by the combination of the sealing ring 518 and the sealing ring 504. The pad 524 is electrically connected to the connection pads via a conductive strip 522 passing under the sealing ring 518. In some implementations, the conductive strip 522 may be integrated into the substrate 516 and adjacent to the sealing ring 518. In some implementations, the conductive strip 522 may be a trace. By connecting under the sealing ring 518 to the pad 524, the device 500 can be coupled to other components (such as any device outside of the display package such as a processor) without breaching the hermetically or semi-hermetically sealed package formed by the sealing ring 518 or the sealing ring 504.

Figure 6:
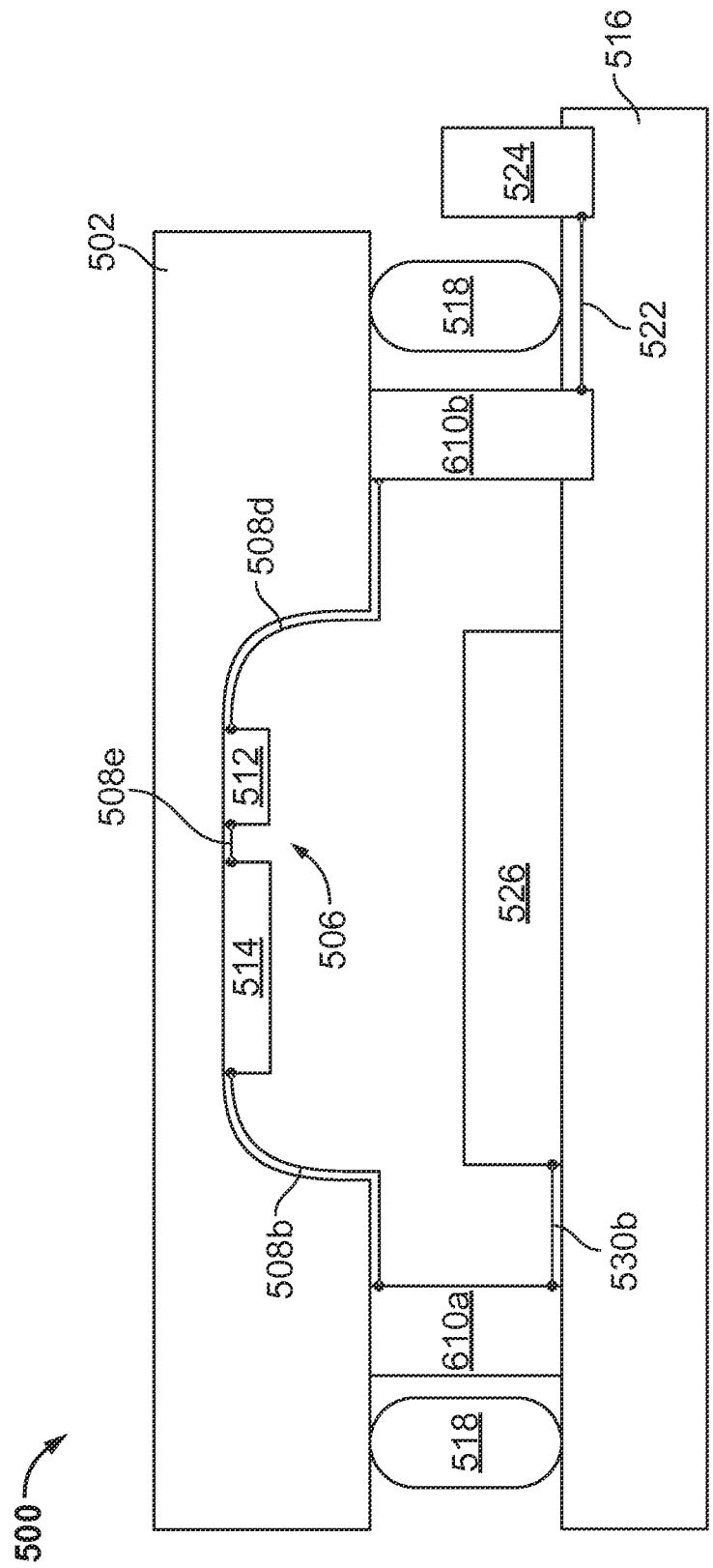
FIG. 6 is a cross-sectional view of an assembled example implementation of a device having back glass interconnects with integrated passives on the glass.

FIG. 6 is a cross-sectional view of an assembled example implementation of a device having back glass interconnects with integrated passives on the glass. The device 500 includes the backplate 502 having the recess 506 as discussed above.

The completed assembly in FIG. 6 shows several sites where the backplate 502 joins the substrate 516. The sealing ring 518 forms a barrier separating the inside of the package from the outside. As shown, the EMS device 526 connects through a trace 530b to a portion of a connection pad 610a on the substrate 516. In this example, the connection 610a includes a second portion connected to the backplate 502. According to the implementation shown in FIG. 6, the second portion of the connection pad 610a connects through a trace 608b to the integrated circuit 514. In this implementation, the integrated circuit 514 connects through a trace 508e to the programmable chip 512. Here, the programmable chip 512 connects through a trace 508d to a portion of a connection pad 610b. The connection pad 610b includes a first and a second portion. The first portion of the connection pad 610b may be in connection with to the backplate 502. The second portion of the connection pad 610b may be in connection with the substrate 516. The second portion of the connection pad 610b connects through a conductive strip 522 to a pad 524.

The conductive strip 522 under the seal ring can be formed using the same process used to fabricate a MEMS device. For example, the metallization process steps for MEMS device fabrication are used to form the traces on the MEMS device glass substrates. The dielectric deposition processes within the MEMS device are then used to cover the traces. This enables the traces to be fabricated on the MEMS device substrate without additional process steps. The dielectric deposition layer is used to cover the traces so that they are not shorted together when the seal ring metallization is fabricated subsequently.

Figure 7:
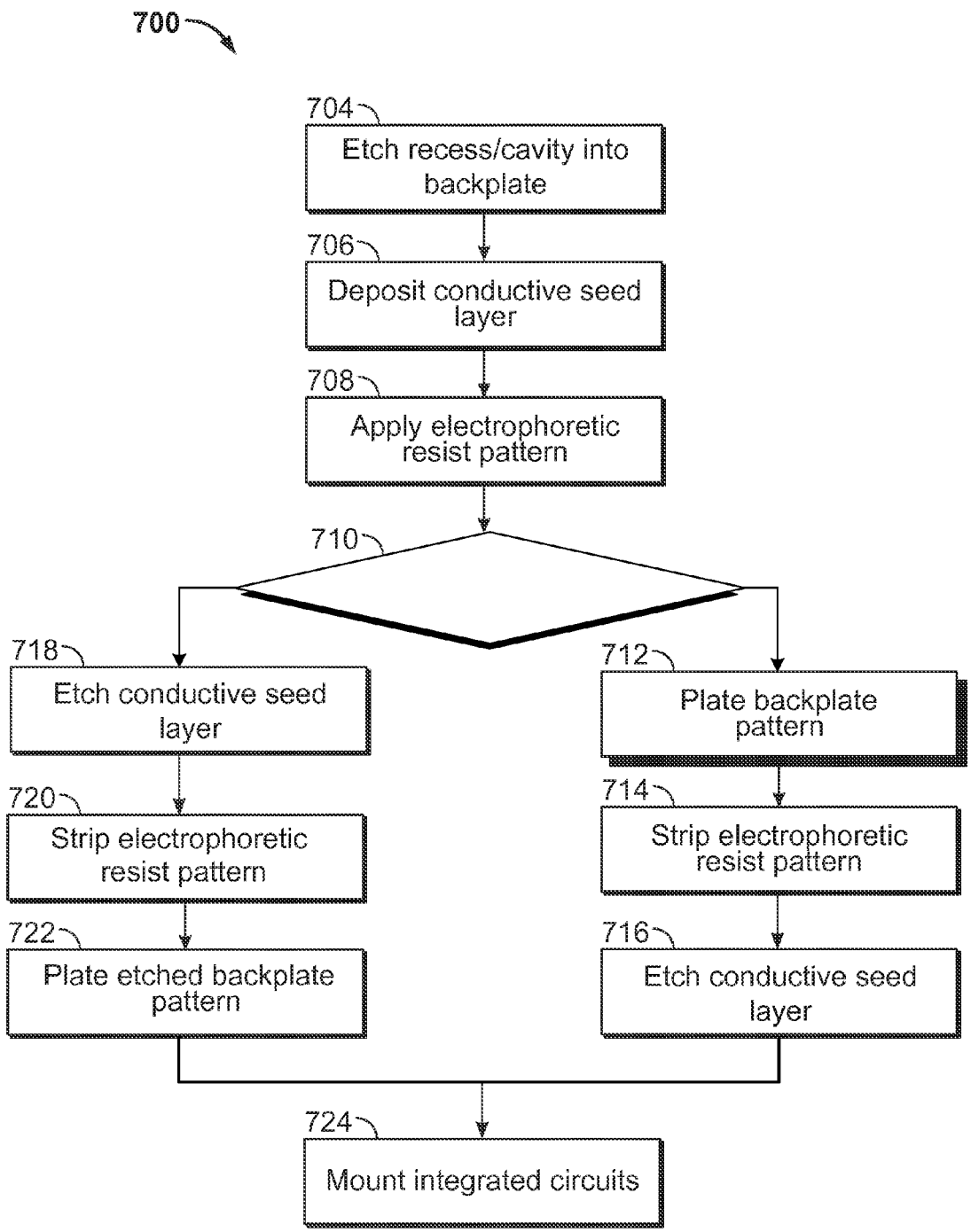
FIG. 7 shows an example process flow diagram for a back glass cover layer metallization process according to some implementations.

FIG. 7 shows an example process flow diagram for a back glass cover layer metallization process according to some implementations. A process 700 can be used to form a backplate such as various implementations of the backplate 502 illustrated in FIGS. 5A, 5B and 6. At a block 704 of the process 700, a recess, or cavity, is etched into the backplate. The recess may be wet etched into the backplate. In some implementations, the wet etching may utilize etchants comprising one or more of hydrofluoric acid, hydrochloric acid, nitric acid, hydrogen peroxide, phosphoric acid or a buffered oxide etch. The recess may be formed through other appropriate means to produce a recessed surface in the recess. In some implementations, the recess has a depth of 100-200 microns. In some implementations, the recess is generally concave in shape, including a flat portion at the apex. According to some other implementations, the backplate includes a plurality of cavities.

At a block 706, a conductive seed layer is deposited on the face of the backplate containing the recess. The conductive seed layer can be applied using one or more of colloidal metal aerosols, jet dispensed paste, sputter deposition (PVD), chemical vapor deposition (CVD), atomic layer deposition (ALD) or evaporation. The material used for the conductive seed layer may be, for example, Al. At a block 708, an electrophoretic resist pattern is applied to the backplate. Depending upon the application, the electrophoretic resist pattern may mask areas where a seed layer is to remain for subsequent plating, or it may expose areas for plating with the resist pattern in place. The electrophoretic resist pattern may be applied using various methods such as spraying and/or spinning. In some implementations, the application of the electrophoretic resist pattern can result in uniform thickness of the electrophoretic resist pattern on the face of the backplate. The uniformity can provide a constant thickness of the backplate, which can reduce the width of the overall package once the backplate is joined with a substrate. Unpredictable width may cause components mounted in the recess to extend into components mounted on the substrate 516 (FIG. 6). This could disrupt the functioning of the device. It is understood that in some implementations process 700 may begin at the block 706, for example, by providing an already recessed backplate and then depositing a conductive seed layer on the recessed backplate. Similarly, in some implementations, the process 700 may begin at the block 708 by providing an already recessed backplate with a conductive seed layer already deposited thereon.

At a decision block 710, two process flow implementations are possible. It is understood that, in some implementations, the decision block 710 is drawn for convenience to show that two process flow implementations are possible and that no logic or program need necessarily implement a decision at the decision block 710. In one implementation, at a block 712, the backplate pattern is plated with a conductive material with the resist pattern masking areas that are to remain unplated. In some implementations, the conductive material can be either individual or combinations of metals and/or alloys such as Cu, Ni, Ni and Co alloy (Ni—Co), silver (Ag), palladium (Pd) or gold (Au). In various implementations, the plating can be electroless plating and/or electrolytic plating. At a block 714 the electrophoretic resist pattern is stripped leaving a pattern of conductive traces on the face of the backplate. This stripping process may be a batch process involving solution chemistry. At a block 716, the conductive seed layer is etched using techniques such as wet etching, dry etching or a combination of wet and dry etching. While such an etch may etch away some of the plated metal, however, in some implementations the conductive seed layer is very thin and is cleaned from the backplate while relatively little of the plated metal is etched away. The etch results in a patterned conductive layer on the backplate.

Alternatively, returning to the decision block 710, the process 700 can defer plating the backplate pattern. In such an alternative implementation, the process 700 at a block 718 proceeds with etching the conductive seed layer using techniques such as wet etching, dry etching or a combination of wet and dry etching. Once the conductive seed layer is etched, in some implementations, the electrophoretic resist pattern is stripped at a block 720 by, for example, a solution chemistry batch process.

At a block 722, the pattern of conductive traces is then plated with a conductive material without an electrophoretic resist pattern. In some implementations, the conductive material can be either individual or combinations of metals and/or alloys such as Cu, Ni, Ni—Co, Ag, Pd or Au. In various implementations, the plating can be electroless plating and/or electrolytic plating. The plating can be generally uniform over the traces, forming a smooth surface with abrupt breaks where resist was stripped. The plating may be performed once, or may be performed more than once. For example, a first layer of Ni may be subsequently plated with a layer of Au.

At a block 724, electrical components such as integrated circuits can be mounted to the conductive traces inside the recess of the backplate. According to an implementation, a programmable chip 512 and an integrated circuit 514 (for example, as shown in FIG. 5B) are attached to the traces using conductive material, such as anisotropic conductive film (ACF) or through flip-chip solder joining. In some implementations, the programmable chip and the integrated circuit are mounted to mounting pads formed on the recess of the backplate, the mounting pads being connected to the conductive traces. Metallization of the lines, pads, and traces can include Au, Ag or Cu as the final metallization. The driver circuit and the associated integrated circuit can be fabricated with wafer level packaging solder bumps. These die can then be joined to the elements on the backplate through flip chip joining techniques.

Figure 8A:
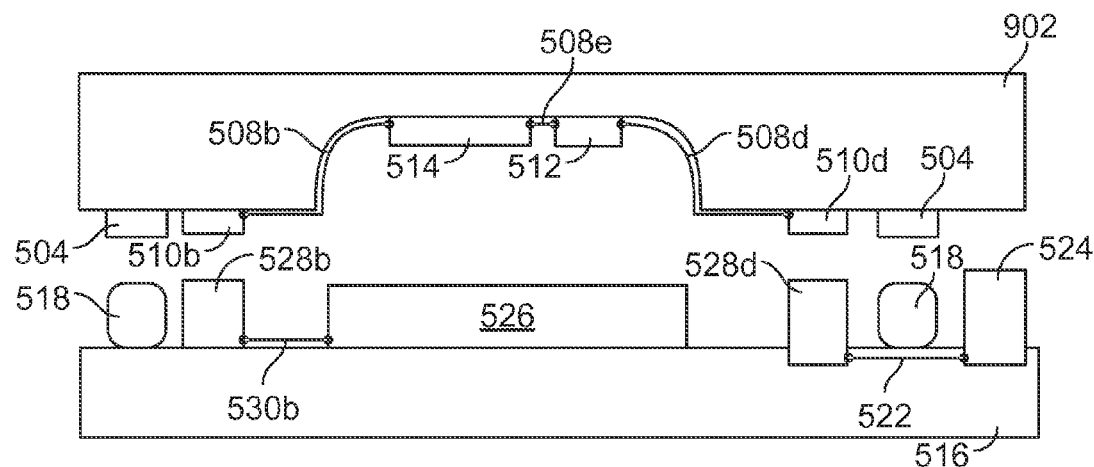
FIGS. 8A-8C show an example backplate and backplate joining process.
Figure 8B:
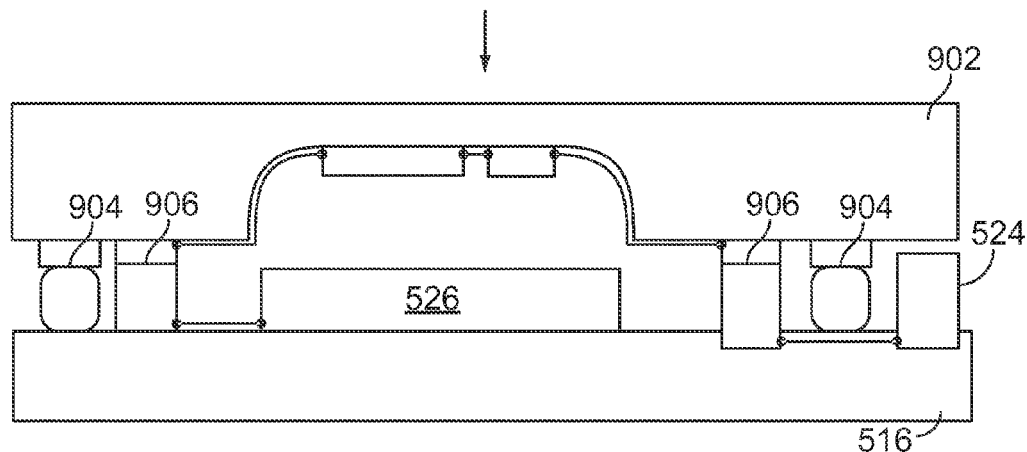
Figure 8C:
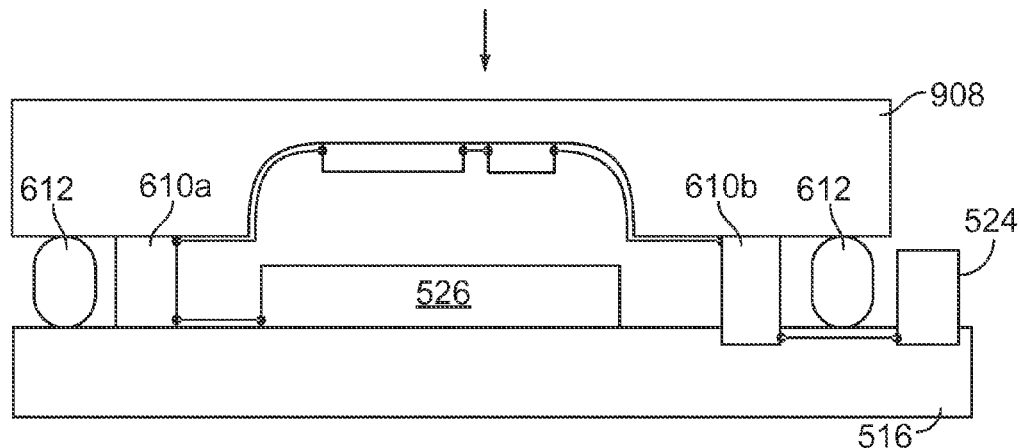

FIGS. 8A-8C show an example backplate and backplate joining process. FIG. 8A shows a backplate 902 that remains unbroken and a substrate 516. The backplate 902 can be formed using the method shown in FIG. 7, for example. In an unbroken form, the backplate 902 is generally as wide as the substrate 516. In some implementations, keeping the width of the backplate 902 and the substrate 516 equal can assist in the manufacturing of the packaging, for example in aligning the backplate 902 and the substrate 516 for joining. After the backplate 902 and the substrate 516 are joined, the backplate 902 may be broken as described with reference to FIG. 8C. The substrate 516 is similar to the substrate described in FIG. 6.

In FIG. 8B, the backplate 902 is joined to the substrate 516. Bonding sites 904 join the upper sealing ring to the lower sealing ring. In the implementation shown in FIG. 8B, the backplate 902 and the substrate 516 both have sealing ring components which can be joined. In some implementations, the backplate 902 may not include a sealing ring component. The sealing ring 518 may be entirely on the substrate 516 such that a sealing ring bonding site 904 is on the face of the backplate 902. The sealing ring bonding can be accomplished using techniques described above in FIG. 5. Once bonded, the seal forms a controlled chamber in the device. In some implementations, the seal formed can be a hermetic seal.

The bonding site 906 joins the upper connection pads to the lower connection pads. The connection pads can be connected using a eutectic mixture of tin and other metals. The choice of metallurgy determines how high the intermetallic compound needs to be heated to melt and then upon cooling forms a solid metal to metal bond with an eutectic compound joining the metal bonding ring between the two glass substrates. The electrical connections between the two glass substrates can also be made in the same process step. In an implementation where a combination of tin and Cu is utilized for bonding, the eutectic metallurgy can be heated to roughly 225 degrees Celsius. In an implementation where a combination of tin (Sn), indium (In), bismuth (Bi) and Cu is utilized for bonding, the eutectic metallurgy can be heated to roughly 150 degrees Celsius. In an implementation where a combination of Sn and Au are utilized, the eutectic metallurgy can be heated to roughly 305 degrees Celsius.

The eutectic metallurgy is heated by heating the entire assembly to the eutectic metallurgy melting temperature (and a few degrees beyond that melting temperature), or by heating only the eutectic metallurgy on the sealing ring through focused heating using lasers where one or more laser beams are focused on the area of interest and not the entire MEMS device surface. In the example shown, the bonding site 906 completes an electrical connection linking the EMS device, integrated circuits in the recess and the pads. The EMS device and integrated circuits are contained within the chamber formed by the sealing ring.

In FIG. 8C, the joining process is completed. The sealing ring 612 is formed. The connection pads 610a and 610b are formed. The backplate 902 is broken to permit connecting the package to connect with other components (such as display controller array, processor or other packages) of the device via, for example, a pad 524. For example, the break provides clearance from the glass for flex tooling to allow attachment to the pad 524. In some implementations, 2 mm is broken from the backplate 902. In some implementations, 1.3 mm is broken from the backplate 902. The backplate 902 may be scored before breaking to provide a smooth break. According to some implementations, the backplate 902 may be cut to yield the final backplate 908 shown in FIG. 8C. In an example implementation, the combined thickness of the backplate 908 and the substrate 516 is less than 2.0 millimeters. In some implementations, the combined thickness of the backplate 908 and the substrate 516 is 0.7 millimeters.

Figure 9A:
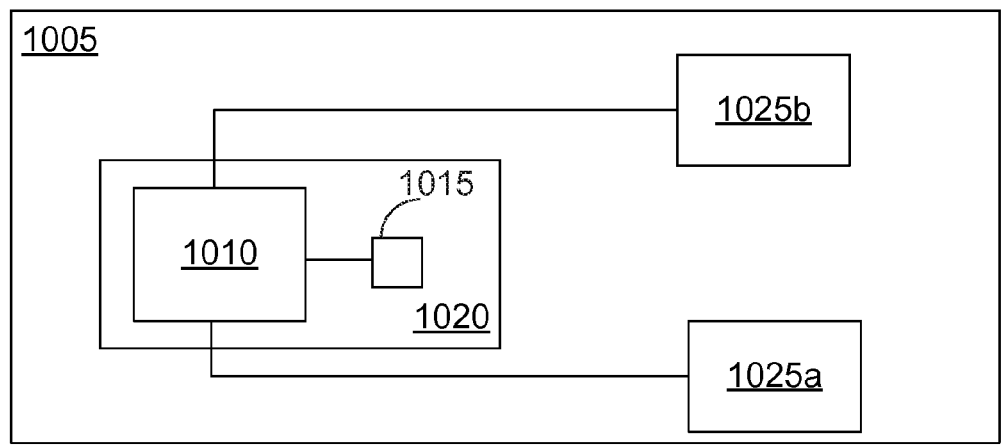
FIGS. 9A-9C show examples of a printed circuit board substrate with a backplate.
Figure 9B:
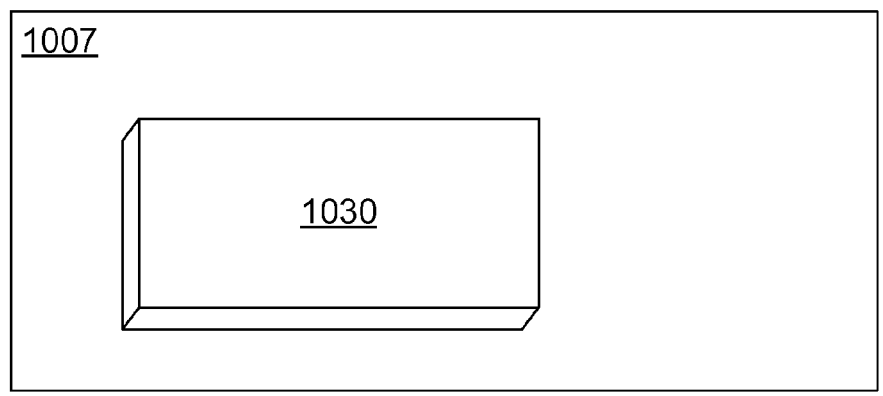
Figure 9C:
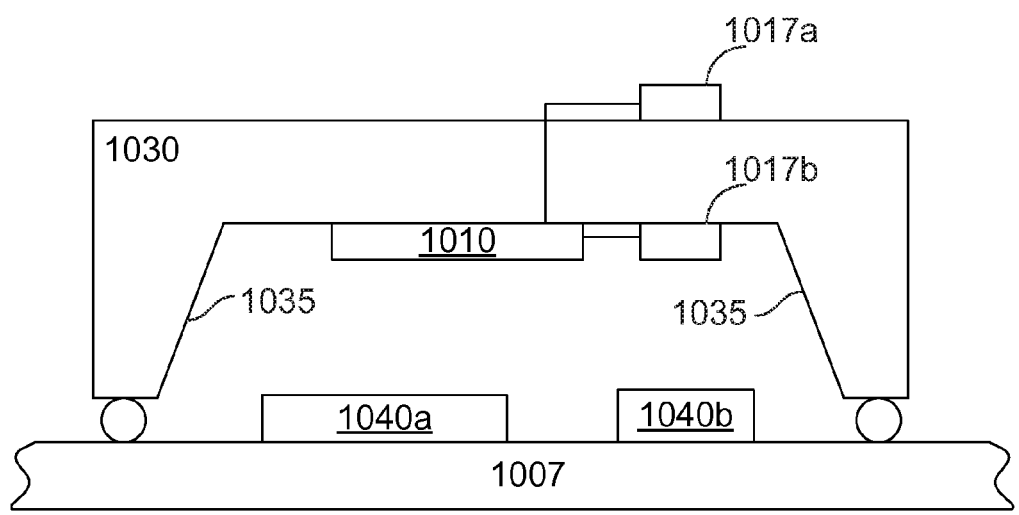

FIGS. 9A-9C show examples of a printed circuit board substrate with a backplate. While illustrated in FIGS. 9A-9C and described below with a printed circuit board as a substrate, other substrates are also possible. For example, the substrate can include a plastic substrate, such as a flexible plastic substrate. In some implementations, the substrate can include any material which does not have electric properties that allow for the formation of passives with good RF characteristics directly on the substrate. In other implementations, the substrate includes expensive substrates, such as silicon, for which reducing the size of the substrate may be useful. FIG. 9A shows an example of a printed circuit board (PCB) 1005 in electrical contact with a device 1010 and passive component(s) 1015 in electrical contact with the device 1010. The device 1010 and the passive component(s) 1015 occupy an area 1020 on the PCB 1005. The device 1010 also may be in electrical contact with one, two or more electrical components 1025a and 1025b, such as a RAM or other such electronic chips. The device 1010 can include one or more of the following: an application specific integrated circuit (ASIC), a field-programmable gate array (FPGA) or other programmable logic circuit, a transceiver (such as for a wireless communication for a cell phone or mobile device), a driver (such as for a display) and/or a power-management integrated circuit (PMIC) for radio-frequency (RF) or other applications. In some implementations, the device 1010 can be any electrical or electromechanical (such as an EMS sensor or other EMS device) that is configured to be electrically connected to a passive component. In the implementation depicted in FIG. 9A, the passive component(s) 1015 may include discrete components such as resistors, inductors or capacitors. In some implementations, passive components can include resonators.

FIG. 9B shows an example of a recessed backplate 1030 mounted onto the PCB 1007. In the implementation depicted in FIG. 9B, the device 1010 and the passive component(s) 1015 of FIG. 9A are mounted onto the recessed backplate 1030 as will be described below in FIG. 9C. Mounting the device 1010 and one or more passive components 1015 onto the recessed backplate 1030 can help reduce the size of the reduced-size PCB 1007, such that the reduced-size PCB 1007 is smaller than the PCB 1005 which does not have any components mounted on a backplate.

FIG. 9C shows an example of a cross-sectional view of a recessed backplate 1030 mounted onto a reduced-size PCB 1007 similar to that of FIG. 9B. As shown in FIG. 9C, the recessed backplate 1030 includes the device 1010 and one or more passive components 1017a and 1017b. As illustrated, a passive component 1017a is formed on the backplate outside of the recess, and may be connected to the device 1010 using through-glass vias or by other means. In various implementations, the recessed backplate may include one or both of passive components 1017a and 1017b, and either of passive components 1017a or 1017b may include one or multiple passive components. In some implementations, the recessed backplate 1030 is made of glass, or another insulating material. The passive components 1017a and 1017b may include capacitors, inductors, resistors and/or resonators. In some implementations, the passive components 1017a and 1017b are not discrete elements, but rather are formed directly onto the backplate 1030. In other words, the passive components 1017a and 1017b can be formed as patterned structures made of deposited metal, dielectric, semiconductor and/or other materials to form resistors, inductors and/or capacitors that are integrated onto the glass backplate 1030, where the glass backplate 1030 serves as a substrate for the passive components 1017a and 1017b. In some implementations, integrating the passive components 10117a and 1017b onto the glass substrate improves the performance of the passive components 1017a and 1017b. In some other implementations, the backplate 1030 may include other substrates upon which integrated passive components can be formed. In some implementations, the passive components 1017a and 1017b are electrically connected to the device 1010. Traces or leads for electrical connection leading from the device 1010 can extend along the inner walls 1035 of the recessed backplate 1030 for electrical contact with pads on the reduced-size PCB 1007. To conserve space, the area of the reduced-size PCB 1007 underneath the recessed backplate 1030 may optionally include additional electronic component(s) (such as electrical components 1040a and/or 1040b) to allow for the PCB 1007 to be as compact as possible.

Figure 10A:
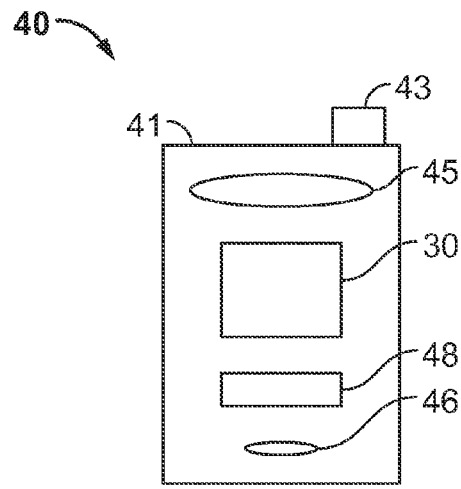
FIGS. 10A and 10B show examples of system block diagrams illustrating a display device that includes a plurality of interferometric modulators.
Figure 10B:
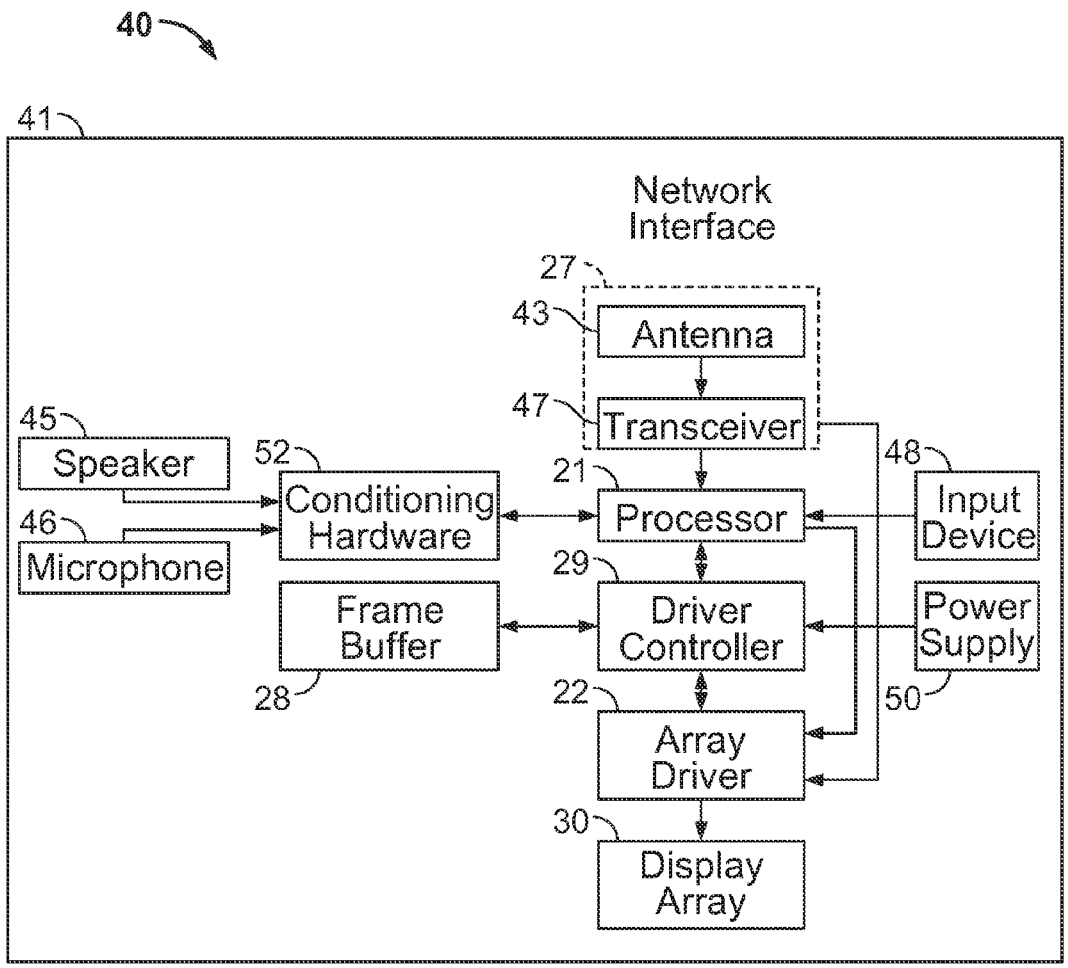

FIGS. 10A and 10B show examples of system block diagrams illustrating a display device that includes a plurality of interferometric modulators. The display device 40 can be, for example, a smart phone, a cellular or mobile telephone. However, the same components of the display device 40 or slight variations thereof are also illustrative of various types of display devices such as televisions, tablets, e-readers, handheld devices and portable media players.

The display device 40 includes a housing 41, a display 30, an antenna 43, a speaker 45, an input device 48 and a microphone 46. The housing 41 can be formed from any of a variety of manufacturing processes, including injection molding and vacuum forming. In addition, the housing 41 may be made from any of a variety of materials, including, but not limited to: plastic, metal, glass, rubber and ceramic or a combination thereof. The housing 41 can include removable portions (not shown) that may be interchanged with other removable portions of different color, or containing different logos, pictures or symbols.

The display 30 may be any of a variety of displays, including a bi-stable or analog display, as described herein. The display 30 also can be configured to include a flat-panel display, such as plasma, EL, OLED, STN LCD or TFT LCD, or a non-flat-panel display, such as a CRT or other tube device. In addition, the display 30 can include an interferometric modulator display, as described herein.

The components of the display device 40 are schematically illustrated in FIG. 10B. The display device 40 includes a housing 41 and can include additional components at least partially enclosed therein. For example, the display device 40 includes a network interface 27 that includes an antenna 43 which is coupled to a transceiver 47. The transceiver 47 is connected to a processor 21, which is connected to conditioning hardware 52. The conditioning hardware 52 may be configured to condition a signal (e.g., filter a signal). The conditioning hardware 52 is connected to a speaker 45 and a microphone 46. The processor 21 is also connected to an input device 48 and a driver controller 29. The driver controller 29 is coupled to a frame buffer 28, and to an array driver 22, which in turn is coupled to a display array 30. In some implementations, a power supply 50 can provide power to substantially all components in the particular display device 40 design.

The network interface 27 includes the antenna 43 and the transceiver 47 so that the display device 40 can communicate with one or more devices over a network. The network interface 27 also may have some processing capabilities to relieve, for example, data processing requirements of the processor 21. The antenna 43 can transmit and receive signals. In some implementations, the antenna 43 transmits and receives RF signals according to the IEEE 16.11 standard, including IEEE 16.11(a), (b) or (g), or the IEEE 802.11 standard, including IEEE 802.11a, b, g, n, and further implementations thereof. In some other implementations, the antenna 43 transmits and receives RF signals according to the BLUETOOTH standard. In the case of a cellular telephone, the antenna 43 is designed to receive code division multiple access (CDMA), frequency division multiple access (FDMA), time division multiple access (TDMA), Global System for Mobile communications (GSM), GSM/General Packet Radio Service (GPRS), Enhanced Data GSM Environment (EDGE), Terrestrial Trunked Radio (TETRA), Wideband-CDMA (W-CDMA), Evolution Data Optimized (EV-DO), 1xEV-DO, EV-DO Rev A, EV-DO Rev B, High Speed Packet Access (HSPA), High Speed Downlink Packet Access (HSDPA), High Speed Uplink Packet Access (HSUPA), Evolved High Speed Packet Access (HSPA+), Long Term Evolution (LTE), AMPS, or other known signals that are used to communicate within a wireless network, such as a system utilizing 3G or 4G technology. The transceiver 47 can pre-process the signals received from the antenna 43 so that they may be received by and further manipulated by the processor 21. The transceiver 47 also can process signals received from the processor 21 so that they may be transmitted from the display device 40 via the antenna 43.

In some implementations, the transceiver 47 can be replaced by a receiver. In addition, in some implementations, the network interface 27 can be replaced by an image source, which can store or generate image data to be sent to the processor 21. The processor 21 can control the overall operation of the display device 40. The processor 21 receives data, such as compressed image data from the network interface 27 or an image source, and processes the data into raw image data or into a format that is readily processed into raw image data. The processor 21 can send the processed data to the driver controller 29 or to the frame buffer 28 for storage. Raw data typically refers to the information that identifies the image characteristics at each location within an image. For example, such image characteristics can include color, saturation and gray-scale level.

The processor 21 can include a microcontroller, CPU, or logic unit to control operation of the display device 40. The conditioning hardware 52 may include amplifiers and filters for transmitting signals to the speaker 45, and for receiving signals from the microphone 46. The conditioning hardware 52 may be discrete components within the display device 40, or may be incorporated within the processor 21 or other components.

The driver controller 29 can take the raw image data generated by the processor 21 either directly from the processor 21 or from the frame buffer 28 and can re-format the raw image data appropriately for high speed transmission to the array driver 22. In some implementations, the driver controller 29 can re-format the raw image data into a data flow having a raster-like format, such that it has a time order suitable for scanning across the display array 30. Then the driver controller 29 sends the formatted information to the array driver 22. Although a driver controller 29, such as an LCD controller, is often associated with the system processor 21 as a stand-alone Integrated Circuit (IC), such controllers may be implemented in many ways. For example, controllers may be embedded in the processor 21 as hardware, embedded in the processor 21 as software, or fully integrated in hardware with the array driver 22.

The array driver 22 can receive the formatted information from the driver controller 29 and can re-format the video data into a parallel set of waveforms that are applied many times per second to the hundreds, and sometimes thousands (or more), of leads coming from the display's x-y matrix of pixels.

In some implementations, the driver controller 29, the array driver 22, and the display array 30 are appropriate for any of the types of displays described herein. For example, the driver controller 29 can be a conventional display controller or a bi-stable display controller (such as an IMOD controller). Additionally, the array driver 22 can be a conventional driver or a bi-stable display driver (such as an IMOD display driver). Moreover, the display array 30 can be a conventional display array or a bi-stable display array (such as a display including an array of IMODs). In some implementations, the driver controller 29 can be integrated with the array driver 22. Such an implementation can be useful in highly integrated systems, for example, mobile phones, portable-electronic devices, watches or small-area displays.

In some implementations, the input device 48 can be configured to allow, for example, a user to control the operation of the display device 40. The input device 48 can include a keypad, such as a QWERTY keyboard or a telephone keypad, a button, a switch, a rocker, a touch-sensitive screen, a touch-sensitive screen integrated with display array 30, or a pressure- or heat-sensitive membrane. The microphone 46 can be configured as an input device for the display device 40. In some implementations, voice commands through the microphone 46 can be used for controlling operations of the display device 40.

The power supply 50 can include a variety of energy storage devices. For example, the power supply 50 can be a rechargeable battery, such as a nickel-cadmium battery or a lithium-ion battery. In implementations using a rechargeable battery, the rechargeable battery may be chargeable using power coming from, for example, a wall socket or a photo-voltaic device or array. Alternatively, the rechargeable battery can be wirelessly chargeable. The power supply 50 also can be a renewable energy source, a capacitor, or a solar cell, including a plastic solar cell or solar-cell paint. The power supply 50 also can be configured to receive power from a wall outlet.

In some implementations, control programmability resides in the driver controller 29 which can be located in several places in the electronic display system. In some other implementations, control programmability resides in the array driver 22. The above-described optimization may be implemented in any number of hardware and/or software components and in various configurations.

Figure 11:
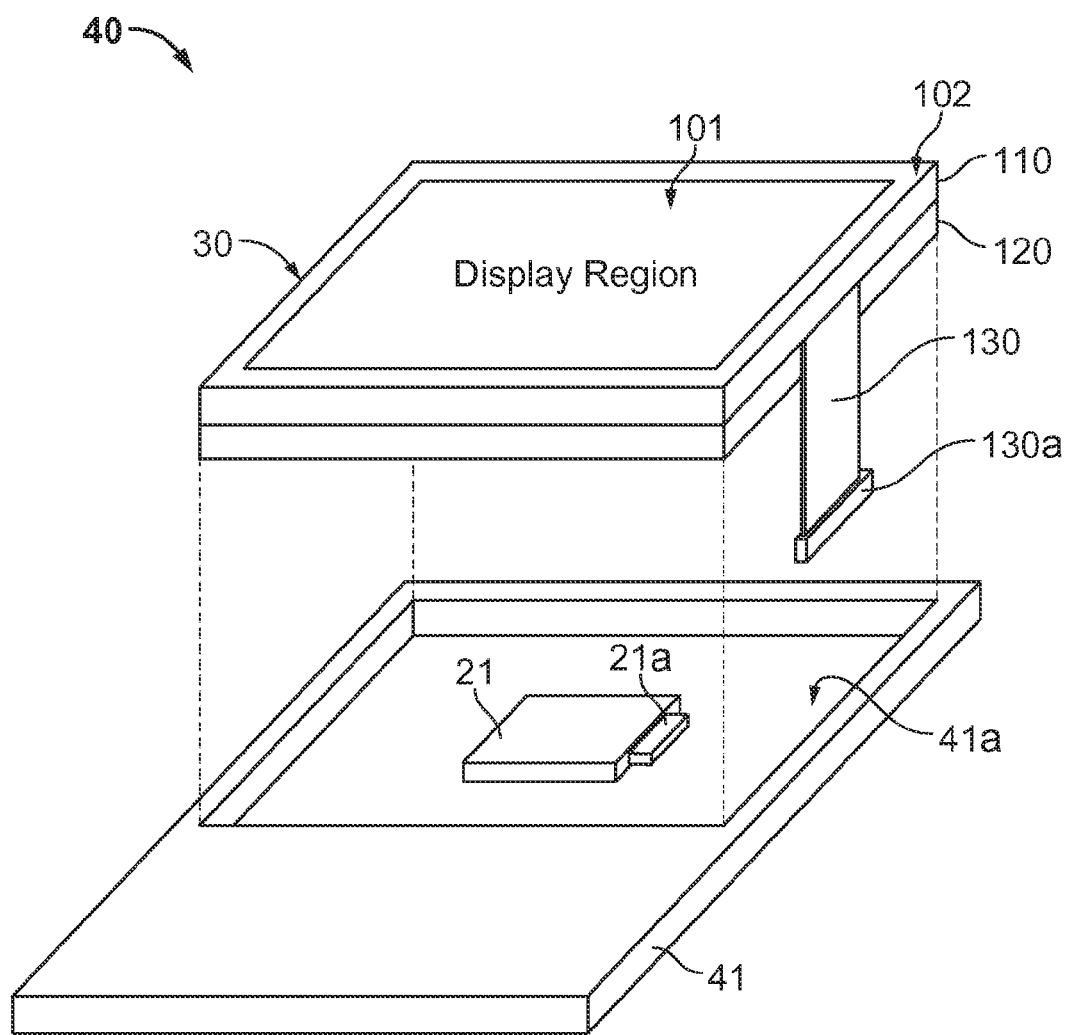
FIG. 11 is an example of a schematic exploded perspective view of the electronic device of FIGS. 10A and 10B according to one implementation.

FIG. 11 is an example of a schematic exploded perspective view of the electronic device of FIGS. 10A and 10B according to one implementation. The illustrated electronic device 40 includes a housing 41 that has a recess 41a for a display array 30. The electronic device 40 also includes a processor 21 on the bottom of the recess 41a of the housing 41. The processor 21 can include a connector 21a for data communication with the display array 30. The electronic device 40 also can include other components, at least a portion of which is inside the housing 41. The other components can include, but are not limited to, a networking interface, a driver controller, an input device, a power supply, conditioning hardware, a frame buffer, a speaker and a microphone, as described earlier in connection with FIG. 10B.

The display array 30 can include a display array assembly 110, a backplate 120 and a flexible electrical cable 130. The display array assembly 110 and the backplate 120 can be attached to each other, using, for example, a sealant.

The display array assembly 110 can include a display region 101 and a peripheral region 102. The peripheral region 102 surrounds the display region 101 when viewed from above the display array assembly 110. The display array assembly 110 also includes an array of display elements positioned and oriented to display images through the display region 101. The display elements can be arranged in a matrix form. In some implementations, each of the display elements can be an interferometric modulator. Also, in some implementations, the term "display element" may be referred to as a "pixel."

The backplate 120 may cover substantially the entire back surface of the display array assembly 110. The backplate 120 can be formed from, for example, glass, a polymeric material, a metallic material, a ceramic material, a semiconductor material or a combination of two or more of the foregoing materials, in addition to other similar materials. The backplate 120 can include one or more layers of the same or different materials. The backplate 120 also can include various components at least partially embedded therein or mounted thereon. Examples of such components include, but are not limited to, a driver controller, array drivers (for example, a data driver and a scan driver), routing lines (for example, data lines and gate lines), switching circuits, processors (for example, an image data processing processor) and interconnects.

The flexible electrical cable 130 serves to provide data communication channels between the display array 30 and other components (for example, the processor 21) of the electronic device 40. The flexible electrical cable 130 can extend from one or more components of the display array assembly 110, or from the backplate 120. The flexible electrical cable 130 can include a plurality of conductive wires extending parallel to one another and a connector 130a that can be connected to the connector 21a of the processor 21 or any other component of the electronic device 40.

The various illustrative logics, logical blocks, modules, circuits and algorithm steps described in connection with the implementations disclosed herein may be implemented as electronic hardware, computer software or combinations of both. The interchangeability of hardware and software has been described generally, in terms of functionality, and illustrated in the various illustrative components, blocks, modules, circuits and steps described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components or any combination thereof designed to perform the functions described herein. A general purpose processor may be a microprocessor, or, any conventional processor, controller, microcontroller or state machine. A processor also may be implemented as a combination of computing devices, such as a combination of a DSP and a microprocessor, a plurality of microprocessors, one or more microprocessors in conjunction with a DSP core, or any other such configuration. In some implementations, particular steps and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

If implemented in software, the functions may be stored on or transmitted over as one or more instructions or code on a computer-readable medium. The steps of a method or algorithm disclosed herein may be implemented in a processor-executable software module which may reside on a computer-readable medium. Computer-readable media includes both computer storage media and communication media including any medium that can be enabled to transfer a computer program from one place to another. A storage media may be any available media that may be accessed by a computer. By way of example, and not limitation, such computer-readable media may include RAM, ROM, EEPROM, CD-ROM or other optical disk storage, magnetic disk storage or other magnetic storage devices, or any other medium that may be used to store desired program code in the form of instructions or data structures and that may be accessed by a computer. Also, any connection can be properly termed a computer-readable medium. Disk and disc, as used herein, includes compact disc (CD), laser disc, optical disc, digital versatile disc (DVD), floppy disk and blue-ray disc where disks usually reproduce data magnetically, while discs reproduce data optically with lasers. Combinations of the above also may be included within the scope of computer-readable media. Additionally, the operations of a method or algorithm may reside as one or any combination or set of codes and instructions on a machine readable medium and computer-readable medium, which may be incorporated into a computer program product.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein. The word "exemplary" is used exclusively herein to mean "serving as an example, instance or illustration." Any implementation described herein as "exemplary" is not necessarily to be construed as preferred or advantageous over other possibilities or implementations. Additionally, a person having ordinary skill in the art will readily appreciate, the terms "upper" and "lower" are sometimes used for ease of describing the figures, and indicate relative positions corresponding to the orientation of the figure on a properly oriented page, and may not reflect the proper orientation of an IMOD as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, a person having ordinary skill in the art will readily recognize that such operations need not be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:
1. An electronic device, comprising:
    a backplate having a recess;
    at least one electronic component mounted in the recess and in electrical communication with one or more upper electrical traces extending from the electronic component to one or more conductive pads on the backplate;
    a substrate having one or more electromechanical devices;
    a seal configured to circumscribe the one or more electromechanical devices and adhere the backplate and the substrate to each other, the seal providing for a sealed area;
    one or more connection pads inside the sealed area; and
    one or more pads outside the sealed area, wherein
        at least one of the one or more connection pads inside the sealed area has a first electrical connection with one of the one or more conductive pads on the backplate, and
        at least one of the one or more connection pads inside the sealed area has a second electrical connection with one of the one or more pads outside the sealed area.
2. The electronic device of claim 1, wherein the second electrical connection passes underneath the seal.
3. The electronic device of claim 1, wherein the second electrical connection is integrated into the substrate.
4. The electronic device of claim 1, further comprising a second electronic component mounted in the recess and electrically coupled to the at least one electronic component.
5. The electronic device of claim 1, wherein the backplate is glass.
6. The electronic device of claim 1, wherein the seal includes a metal to metal seal.
7. The electronic device of claim 1, wherein the seal includes an epoxy seal.
8. The electronic device of claim 1, wherein the substrate has one or more second connection pads providing an electrical connection from the at least one electronic component to the electromechanical device.
9. The electronic device of claim 1, wherein the electromechanical device is an interferometric modulator device.
10. The electronic device of claim 1, wherein one or more pads outside the sealed area include one or more flex pads.
11. The electronic device of claim 1, further comprising:
    a display;
    a processor that is configured to communicate with the display, the processor being configured to process image data; and
    a memory device that is configured to communicate with the processor.
12. The electronic device of claim 11, wherein the electromechanical device is the display.
13. The device of claim 11, further comprising:
    a driver circuit configured to send at least one signal to the display; and
    a controller configured to send at least a portion of the image data to the driver, wherein the at least one electronic component includes one of the driver circuit and the controller.
14. The device of claim 11, further comprising:
    an image source module configured to send the image data to the processor.

15. The device of claim 14, wherein the image source module includes at least one of a receiver, transceiver, and transmitter and wherein the at least one electronic component includes one of the receiver, transceiver, and transmitter.

16. The device of claim 11, further comprising:
an input device configured to receive input data and to communicate the input data to the processor.

17. A method of manufacturing a display device, comprising:
etching a recess into a backplate;
depositing a conductive seed layer on the backplate;
applying a resist pattern to the backplate;
etching the conductive seed layer on the backplate;
stripping the resist pattern from the backplate;
plating the etched backplate pattern to form electrical traces from electrical component mounting pads within the etched recess to conductive pads outside the etched recess; and
mounting one or more electrical components to the mounting pads on the backplate.

18. The method of claim 17, wherein etching the recess into the backplate includes etching the recess into a glass backplate.

19. The method of claim 17, wherein depositing the conductive seed layer includes depositing a layer of aluminum.

20. The method of claim 17, wherein depositing includes at least one of colloidal metal aerosols, jet dispensed paste, sputter deposition (PVD), chemical vapor deposition (CVD), atomic layer deposition (ALD) or evaporation.

21. The method of claim 17, wherein plating includes electroless plating.

22. The method of claim 17, wherein mounting one or more electrical components includes mounting a display driver circuit.

23. A method of manufacturing a display device, comprising:
providing a backplate having a recess and one or more electrical traces that run from electrical component mounting pads in the recess to one or more conductive pads on the backplate;
mounting at least one electrical component onto the mounting pads;
providing a substrate, the substrate having an electromechanical device, two or more connection pads, and one or more external pads, wherein at least one of the two or more connection pads are electrically connected to one of the one or more external pads; and
sealing the substrate to the backplate to form a package wherein at least one of the two or more connection pads are electrically connected to one of the one or more conductive pads, and wherein the electromechanical device and the two or more connection pads are internal to the seal and the external pads are external to the seal.

24. The method of claim 23, wherein providing the recessed backplate includes forming the one or more electrical traces on the backplate.

25. The method of claim 23, wherein providing a substrate having an electromechanical device includes providing a substrate having an interferometric modulator device.

26. The method of claim 23, wherein mounting the at least one electrical component includes mounting a display driver circuit.

27. The method of claim 23, wherein the external pads are electrically connected to the two or more connection pads by electrical traces integrated into the substrate.

28. The method of claim 23, wherein providing a substrate having the one or more external pads includes providing a substrate having one or more flex pads.

29. An electronic display device, comprising:
a backplate having a recess;
at least one electronic component mounted in the recess and in electrical communication with one or more upper electrical traces extending from the electrical component to one or more conductive pads on the backplate;
a substrate having an electromechanical device, wherein the electromechanical device is electrically connected to the electronic components;
means for sealing configured to circumscribe the electromechanical device and adhere the backplate and the substrate to each other, the seal providing for a sealed area;
one or more pads outside the sealed area; and
means for electrically connecting the one or more conductive pads on the backplate to the one or more pads outside the seal wherein at least one of the electrically connected one or more conductive pads is in electrical communication with the electromechanical device.

30. The electronic display device of claim 29, wherein the means for electrically connecting is a conductive trace.

31. The electronic display device of claim 30, wherein the conductive trace runs underneath the seal.

32. The electronic display device of claim 30, wherein the conductive trace is integrated into the substrate.

33. An electronic display device comprising:
a substrate;
a recessed backplate attached to the substrate;
one or more passive devices formed on the recessed backplate; and
a device attached inside a recess on the backplate and electrically connected to two or more leads, wherein at least one of the two or more leads is electrically connected to the one or more passive devices and another of the two or more leads is electrically connected to a pad on the substrate.

34. The device of claim 33, wherein the substrate is a printed circuit board.

35. The device of claim 33, wherein the recessed backplate is formed of glass.

36. The device of claim 33, wherein the device attached to the backplate is at least one of an application specific electrical component, a transceiver, a power management electrical component, and a microelectromechanical system.

37. The device of claim 33, wherein the one or more passive elements include one or more of a capacitor, an inductor, a resistor, and a resonator.

* * * * *